(12) United States Patent
Ogawa

(10) Patent No.: US 7,078,103 B2
(45) Date of Patent: Jul. 18, 2006

(54) CONDUCTIVE ORGANIC THIN FILM, PROCESS FOR PRODUCING THE SAME, AND ORGANIC PHOTOELECTRONIC DEVICE, ELECTRIC WIRE, AND ELECTRODE EACH EMPLOYING THE SAME

(75) Inventor: Kazufumi Ogawa, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 160 days.

(21) Appl. No.: 10/451,166

(22) PCT Filed: Dec. 25, 2001

(86) PCT No.: PCT/JP01/11324

§ 371 (c)(1),
(2), (4) Date: Jun. 19, 2003

(87) PCT Pub. No.: WO02/052581

PCT Pub. Date: Jul. 4, 2002

(65) Prior Publication Data

US 2004/0056237 A1    Mar. 25, 2004

(30) Foreign Application Priority Data

Dec. 26, 2000   (JP) ............................. 2000-395701

(51) Int. Cl.
*B32B 7/04* (2006.01)
(52) U.S. Cl. ..................................... 428/447; 428/910
(58) Field of Classification Search ................ 428/447, 428/910
See application file for complete search history.

(56) References Cited

U.S. PATENT DOCUMENTS

| | | | |
|---|---|---|---|
| 3,957,347 A * | 5/1976 | Saeva ......................... 349/193 |
| 5,008,127 A | 4/1991 | Ogawa |
| 5,017,975 A | 5/1991 | Ogawa |
| 5,130,162 A | 7/1992 | Ogawa et al. |
| 5,223,331 A * | 6/1993 | Ogawa et al. ............... 428/209 |
| 5,270,417 A | 12/1993 | Soga et al. |
| 5,326,661 A * | 7/1994 | Sansone et al. ............... 430/20 |
| 5,353,632 A * | 10/1994 | Nakagawa ................... 73/105 |
| 5,413,887 A * | 5/1995 | Ueda ......................... 430/58.5 |
| 5,468,551 A | 11/1995 | Ogawa |
| 5,676,814 A * | 10/1997 | Honda et al. ................. 205/67 |
| 5,965,761 A * | 10/1999 | Buchecker et al. ......... 556/440 |
| 6,995,506 B1 | 2/2006 | Ogawa et al. |
| 2002/0057398 A1 | 5/2002 | Ogawa |

FOREIGN PATENT DOCUMENTS

| CN | 1483205 | 3/2004 |
|---|---|---|
| EP | 0 339 677 | 11/1989 |
| EP | 0 383 584 | 8/1990 |
| EP | 0 385 656 | 9/1990 |
| EP | 0 441 326 | 8/1991 |
| EP | 0 469 243 | 2/1992 |
| EP | 0 552 637 | 7/1993 |
| EP | 0 962 460 | 12/1999 |
| EP | 1 179 863 | 2/2002 |
| JP | 34-19965 | 12/1959 |
| JP | 59-57741 | 4/1984 |
| JP | 60-146406 | 8/1985 |
| JP | 2-27766 | 1/1990 |
| JP | 3-229710 | 10/1991 |
| JP | 5-81921 | 4/1993 |
| JP | 5-87559 | 4/1993 |
| JP | 5-117624 | 5/1993 |
| JP | 5-175485 | 7/1993 |
| JP | 5-274919 | 10/1993 |
| JP | 6-242352 | 9/1994 |
| JP | 7-66990 | 7/1995 |
| JP | 8-50818 | 2/1996 |
| JP | 2507153 | 4/1996 |
| JP | 9-162440 | 6/1997 |
| JP | 10-153783 | 6/1998 |
| JP | 2000-268634 | 9/2000 |

OTHER PUBLICATIONS

"Novel entry to the tropane system by reaction of rhodium(II) acetate stabilized vinylcarbenoids with pyrroles." Tetrahedron Letters, vol. 30, No. 35, 1989, pp. 4653-4656.

"Synthesis of (±) -Ferruginine and (±) -Anhydroecgonine Methyl Ester by a Tandem Cyclopropanation/Cope Rearrangement" J. Org. Chem., vol. 56, No. 19, 1991, pp. 5696-5700.

Collard, David M. et al. "Lamellar Conjugated Polymers by Electrochemical Polymerization of Heteroarene-Containing Surfactants: Potassium 3-(3-Alkylpyrrol-1-yl)propanesulfonates," Chemistry of Materials. vol. 6, pp. 850-857 (1994).

(Continued)

*Primary Examiner*—Margaret G. Moore
(74) *Attorney, Agent, or Firm*—Hamre, Schumann, Mueller & Larson, P.C.

(57) ABSTRACT

A conductive organic thin film includes organic molecules, each of which has: a terminal binding group that is bound with a surface of a substrate by a covalent bond, the terminal binding group being present at one of the ends of the organic molecule; a conjugate group that is polymerized with another molecule, the conjugate group being present in the organic molecule; and a photoresponsive functional group including no active hydrogen, the photoresponsive functional group being present between the terminal binding group and the conjugate group. In the conductive organic thin film, the organic molecules are aligned, and the conjugate group of each molecule is polymerized with the conjugate group of another molecule so that a conductive network is formed. This conductive organic thin film has an optical switching function, having a conductivity that varies in response to irradiation of light.

7 Claims, 10 Drawing Sheets

OTHER PUBLICATIONS

Lo, Rung-Kuang et al. Polypyrrole Growth on $YBa_2Cu_3O_{7-0}$ Modified with a Self-Assembled Monolayer of N-(3-Aminopropyl)pyrrole: Hardwiring the "Electroactive Hot Spots: on a Superconductor Electrode" Journal of The American Chemical Society, vol. 118, pp. 11295-11296 (1996).

Michalitsch R. et al. "β-Functionalized Oligothiophenes for Molecular self-assembly" Synthetic Metals, vol. 101, pp. 5-6 (1999).

Berlin. Anna et al. "Self-assembly of mono- and multilayers of polyconjugated conducting polymers" Macromolecular Rapid Communications, vol. 21, pp. 301-318 (2000).

* cited by examiner

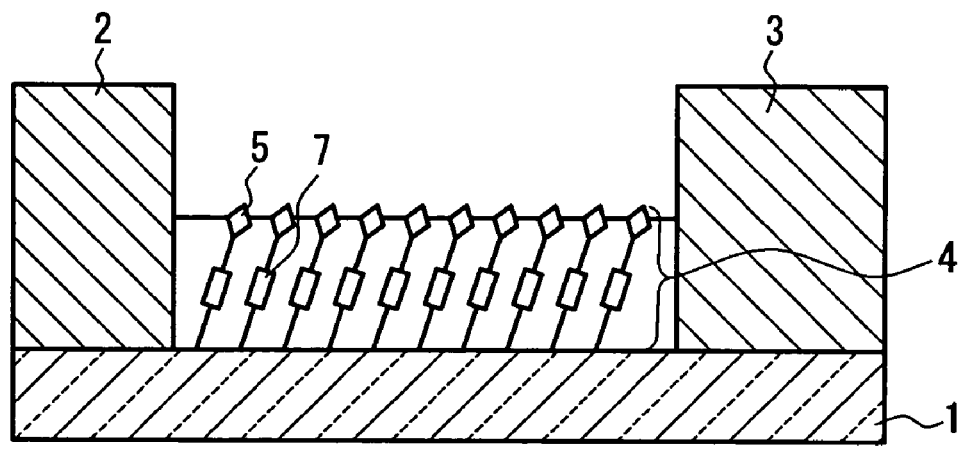
F I G. 6A
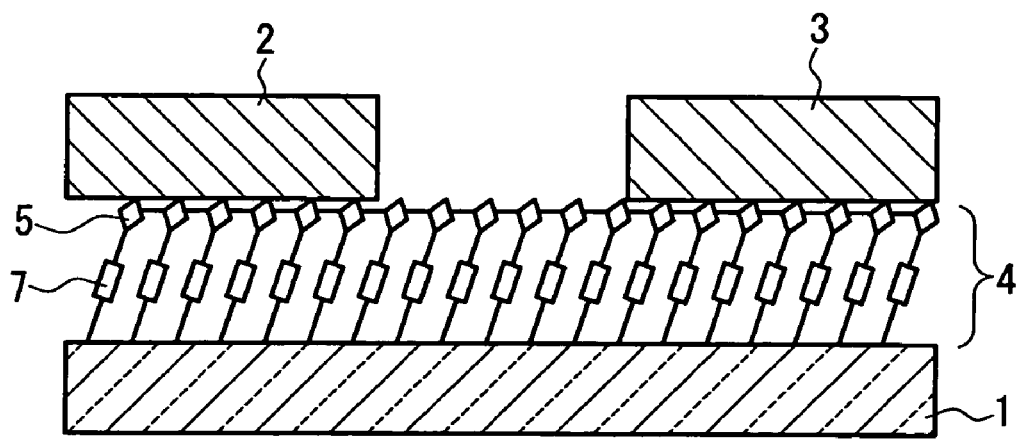
F I G. 6B

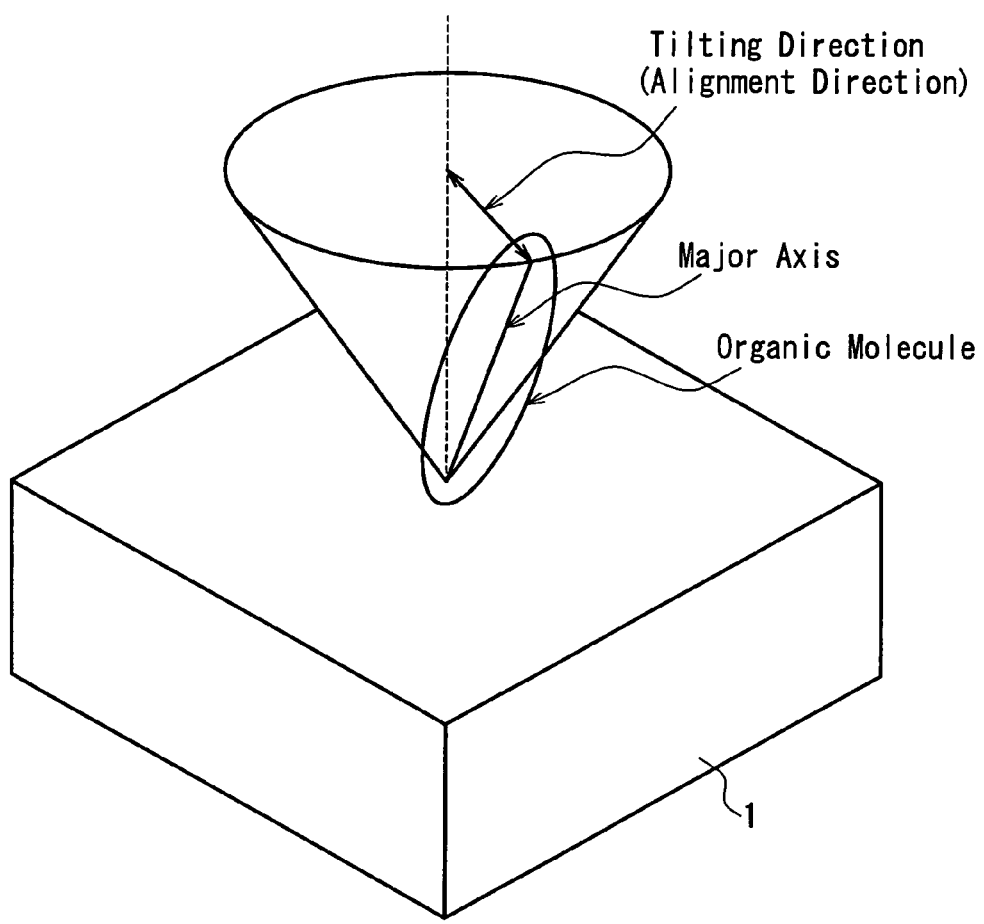
F I G. 1 2
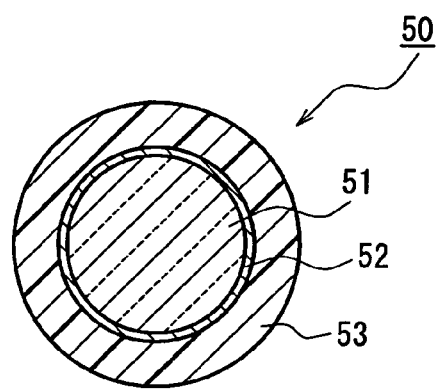
F I G. 1 3

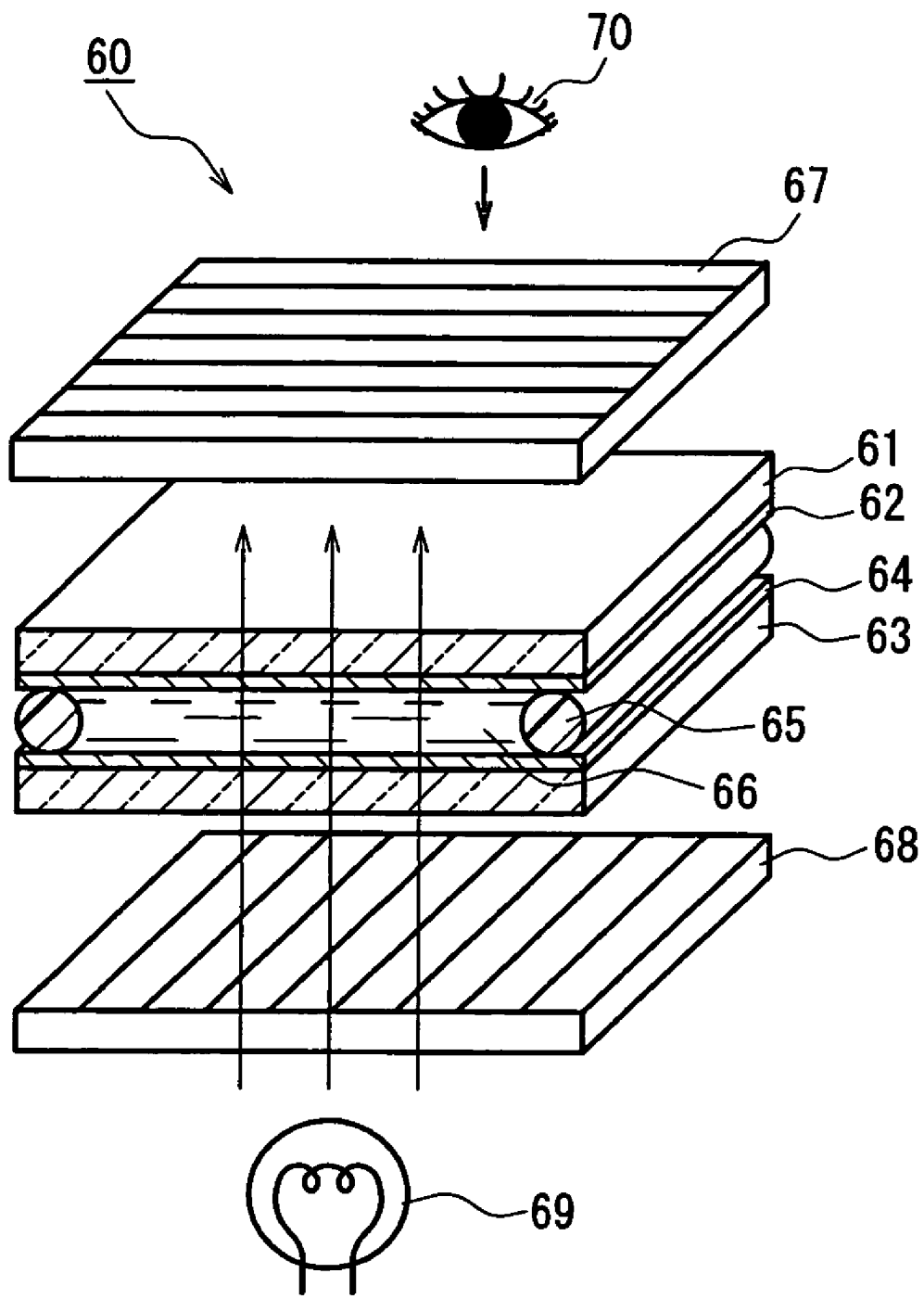
F I G. 1 4

CONDUCTIVE ORGANIC THIN FILM, PROCESS FOR PRODUCING THE SAME, AND ORGANIC PHOTOELECTRONIC DEVICE, ELECTRIC WIRE, AND ELECTRODE EACH EMPLOYING THE SAME

TECHNICAL FIELD

The present invention relates to a conductive organic thin film in which an organic material is used, a method for producing the same, and an organic photoelectronic device, a wire, and an electrode each of which employs the conductive organic thin film. More specifically, the present invention relates to an organic photoelectronic device, a wire, and an electrode, each of which utilizes a photoresponsive change in a monomolecular film, a monomolecular build-up film, or a thin film, each of which has conductivity and photoresponsivity.

BACKGROUND ART

Conventionally, various proposals have been made concerning an organic conductive film. The applicant of the present application has proposed a conductive film having a conductive conjugate group, such as films made of polyacetylene, polydiacetylene, polyacene, polyphenylene, polythienylene, polypyrrole, and polyaniline (JP2(1990)-27766A, U.S. Pat. No. 5,008,127, EP-A-0385656, EP-A-0339677, EP-A-0552637, U.S. Pat. No. 5,270,417, JP5(1993)-87559A, and JP6(1994)-242352A).

Further, conventionally an inorganic semiconductor material typified by silicon crystal is used in an electronic device. As for an electronic device in which an organic material is used (hereinafter referred to as an organic electronic device), examples thereof are disclosed in, for instance, Japanese Patent No. 2034197 and Japanese patent No. 2507153. The organic electronic devices disclosed in the foregoing publications are configured so as to switch electric current running between terminals in response to an electric field applied thereto.

The foregoing conventional organic conductive film has a problem of the conductivity being lower as compared with that of a metal film. Besides, in the case of an inorganic crystal conventionally used, crystal defects have more significant influences as the microstructuring is promoted, and a problem has arisen in that the quality of crystal significantly affects device properties. Besides, a problem of deteriorated flexibility has arisen also.

DISCLOSURE OF THE INVENTION

The present invention is made in light of the foregoing problems, and it is an object of the present invention to provide a densely-packaged conductive and photoresponsive device by producing a device in which an organic substance is used that does not depend on crystallinity even if the device is subjected to micromachining on the order of 0.1 µm or less for denser packaging. Further, it is possible to provide an organic photoelectronic device with excellent flexibility by forming the same on a plastic substrate or the like.

To achieve the foregoing object, a conductive organic thin film of the present invention is formed with organic molecules, each of which includes: a terminal binding group that is bound with a surface of a substrate by a covalent bond, the terminal binding group being present at one of the ends of the organic molecule; a conjugate group that is polymerized with another molecule, the conjugate group being present at a certain position in the organic molecule; and a photoresponsive functional group including no active hydrogen, the photoresponsive functional group being present at a certain position between the terminal binding group and the conjugate group. In the film, the organic molecules are aligned, and the conjugate group of each molecule is polymerized with the conjugate group of another molecule so that a conductive network is formed.

A method for manufacturing a conductive organic thin film of the present invention includes the substrate and chemical compound preparing step, an organic thin film forming step, a tilting step, and a conductive network forming step. In the substrate and chemical compound preparing step, a substrate is prepared that has active hydrogen on its surface or to whose surface active hydrogen is applied, and a chemical compound is prepared that is composed of organic molecules. Each of the organic molecule includes: a terminal functional group that is to be bound with a surface of the substrate by a covalent bond, the terminal binding group being present at one of the ends of the organic molecule; a conjugatable group that is to be polymerized with another molecule, the conjugatable group being present at a certain position in the organic molecule; and a photoresponsive functional group including no active hydrogen, the photoresponsive functional group being present at a certain position between the terminal functional group and the conjugatable group. In the organic thin film forming step, an organic thin film is formed with the chemical compound by bringing the chemical compound in contact with the substrate so that covalent bonds are formed through an elimination reaction. In the tilting step, the organic molecules composing the organic thin film are tilted in a predetermined direction for alignment. In the conductive network forming step, a conductive network is formed by conjugating the conjugatable groups by at least one polymerizing method selected from electrolytic oxidation polymerization, catalystic polymerization, and energy beam polymerization.

A two-terminal organic photoelectronic device of the present invention includes a first electrode formed on a substrate, a second electrode arranged separately from the first electrode, and a conductive organic thin film electrically connecting the first and second electrodes with each other. In the foregoing device of the present invention, the conductive organic thin film comprises organic molecules. Each of the organic molecules includes: a terminal binding group that is bound with a surface of a substrate by a covalent bond, the terminal binding group being present at one of the ends of the organic molecule; a conjugate group that is polymerized with another molecule, the conjugate group being present at a certain position in the organic molecule; and a photoresponsive functional group including no active hydrogen, the photoresponsive functional group being present at a certain position between the terminal binding group and the conjugate group. In the device, the organic molecules are aligned, and the conjugate groups are polymerized so that a conductive network is formed.

An electric cable of the present invention includes a core wire, a conductive organic thin film formed in a lengthwise direction of a surface of the core wire, and an insulation coating covering the conductive organic thin film. In the electric cable, the conductive organic thin film comprises organic molecules, each of which includes: a terminal binding group that is bound with a surface of a substrate of the core wire by a covalent bond, the terminal binding group being present at one of the ends of the organic molecule; a conjugate group that is polymerized with another molecule, the conjugate group being present at a certain position in the organic molecule; and a photoresponsive functional group including no active hydrogen, the photoresponsive functional group being present at a certain position between the terminal binding group and the conjugate group. In this electric cable, the organic molecules are aligned, and the conjugate groups are polymerized by electrolytic oxidation polymerization so that a conductive network is formed.

An electrode of the present invention is transparent with respect to light having a wavelength in a visible range, and the electrode is a conductive organic thin film comprising organic molecules. Each of the organic molecules includes: a terminal binding group that is bound with a surface of a substrate by a covalent bond, the terminal binding group being present at one of the ends of the organic molecule; a conjugate group that is polymerized with another molecule, the conjugate group being present at a certain position in the organic molecule; and a photoresponsive functional group including no active hydrogen, the photoresponsive functional group being present at a certain position between the terminal binding group and the conjugate group. In the electrode, the organic molecules are aligned, and the conjugate groups are polymerized so that a conductive network is formed.

BRIEF DESCRIPTION OF DRAWINGS

FIG. 5A is a cross-sectional view of an X conductive monomolecular build-up film that is formed by chemisorption and in which respective alignment directions of the monomolecular layers are uniform. FIG. 5B is a cross-sectional view of a Y conductive monomolecular build-up film in which layers other than a first layer composes a build-up film formed by the Langmuir-Blodgett technique, and in which respective alignment directions of the monomolecular layers are uniform. FIG. 5C is a cross-sectional view of an X conductive monomolecular build-up film in which respective alignment directions of the monomolecular layers are different. FIG. 5D is a cross-sectional view of an X conductive monomolecular build-up film in which each monomolecular layer is aligned in either one of two alignment directions.

FIGS. 6A and 6B are conceptual magnified views illustrating examples of a structure of a two-terminal organic photoelectronic device according to Embodiment 3 of the present invention, which are magnified to a molecular level. FIG. 6A is a cross-sectional view of a structure in which first and second electrodes are formed on a surface of a substrate, and FIG. 6B is a cross-sectional view of a structure in which first and second electrodes are formed on a surface of an organic thin film.

FIG. 7A is a conceptual view illustrating the variation of the conductivity of the organic thin film with irradiation of light. FIG. 7B is a conceptual view illustrating a switching operation in response to photoisomerization.

FIG. 12 is a conceptual perspective view illustrating a tilting direction of organic molecules according to Embodiment 1 of the present invention.

FIG. 13 is a conceptual cross-sectional view of an electric cable obtained in Example 2 of the present invention.

FIG. 14 is an explanatory view illustrating a method for evaluating an alignment of conductive molecules in Example 3 of the present invention.

Figure 1A:
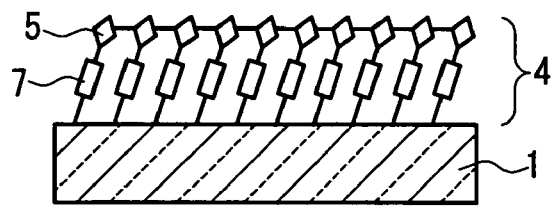
FIG. 1A is a conceptual magnified cross-sectional view of a conductive monomolecular film formed on a substrate according to Embodiment 1 of the present invention, which is magnified to a molecular level.

1: substrate, 2: first electrode, 3: second electrode, 4: photoresponsive conductive monomolecular film, 5: conductive network, 6: converged light, 7: polarized functional group including no active hydrogen, 21: glass substrate, 22: first electrode made of nickel, 23: second electrode made of nickel, 24: photoresponsive monomolecular film, 24*a*: monomolecular film, 24*b*: aligned monomolecular film, 24*c*: conductive monomolecular film, 25: conductive network, 41: rubbing cloth, 42: rubbing roll, 43: polarization plate, 44: organic solvent, 50: electric cable, 51: glass core wire, 52: polypyrrole electrolytic-oxidation-polymerization film, 53: coated insulation film, 60: liquid crystal cell

DESCRIPTION OF THE INVENTION

In the present invention, the conductivity of an organic thin film is attributed to molecules composing an organic molecule aggregate being polymerized with one another by conjugated bonds. In the film, a conductive network is formed by a polymer that is an aggregate of organic molecules bound with each other by conjugate bonds that are responsible for electrical conductivity, thereby having conjugated bond chains (conjugated systems). Further, the conductive network is formed so as to extend between electrodes. The conjugated bond chain polymer does not range strictly in one direction, but preferably polymer chains extending in various directions are formed roughly through a range between the electrodes.

If the organic molecules possess photoresponsive functional groups, they have an improved sensitivity to light, and hence, an enhanced responding speed. Accordingly, they cause the conductivity of a photoresponsive conductive organic thin film to vary at a high speed. It is considered that the variation of the conductivity in response to irradiation of light is caused because a photoresponsive functional group responds to light and the response has a ripple effect on the structure of the conductive network.

The photoresponsivity is a property that causes a reversible change in a state of a molecule in response to irradiation of light. Examples of the photoresponsivity include photoisomerization typified by the cis-trans isomerization in which the order (array) of bonds of atoms composing a molecule remains unchanged but a spatial arrangement of the same changes. Therefore, a change in conductivity of an organic thin film is a reversible change, being reversible to a predetermined state in response to irradiation of a combination of light with different wavelengths.

By doping a charge-transfer-type dopant substance in the conductive network, it is possible to enhance the conductivity. As the dopant substance, any dopant substance may be used, such as iodine, $BF^-$ ion, alkaline metals, alkaline earth metals, etc. Further, other dopant substances may be included, as a result of being mixed unavoidably due to contamination from trace components contained in a solution used an organic film forming process, from a glass container, and the like.

The conjugate group that functions in the polymerization preferably is at least one selected from conjugate groups that function in forming polypyrrole, polythienylene, polyacetylene, polydiacetylene, and polyacene.

The photoresponsive functional group including no active hydrogen preferably is an azo group (—N=N—).

The terminal binding group preferably forms at least one type of bond selected from a siloxane-type (—SiO—) bond and a —SiN— type bond.

The terminal binding group preferably is formed by at least one elimination reaction selected from the dealcoholization and the dehydrochlorination. The molecular film formed by this method usually is called "chemisorption film" or "self-assemble film" in the art, but herein it is referred to as "chemisorption film", and a method for forming the same is referred to as "chemisorption method".

In the present invention, the alignment of the molecules preferably is achieved by at least one type of process selected from: an alignment process by rubbing; a tilt draining process of lifting up a substrate with a tilt out of a reaction solution after molecules are bound with a surface of the substrate by covalent bonds through an elimination reaction; and a polarized-light projecting process.

A conductive portion of the organic thin film preferably is transparent with respect to light having a wavelength in a visible range.

The organic molecules preferably are a chemical compound expressed by a chemical formula (A) below:

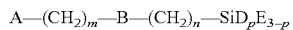  (A)

where

A represents a conjugatable group including at least one selected from a pyrrole group, a thienyl group, an acetylene group, and a diacetylene group, which is to be bound by forming a conjugated bond so as to form a conductive network, B represents a photoresponsive functional group, D represents at least one reactive group selected from a halogen atom, an isocyanate group, and an alkoxyl group having one to three carbon atoms, E represents at least one group selected from hydrogen, and an alkyl group having one to three carbon atoms, m and n represent integers satisfying $2 \leq m+n \leq 25$, particularly preferably $10 \leq m+n \leq 20$ and p represents an integer of 1, 2, or 3.

The organic molecules preferably are a chemical compound expressed by any one of chemical formulae (B) to (E) below:

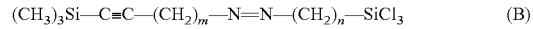 (B)

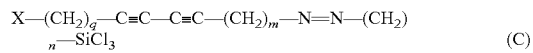 (C)

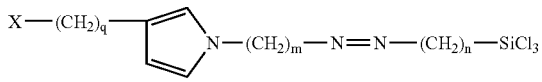 (D)

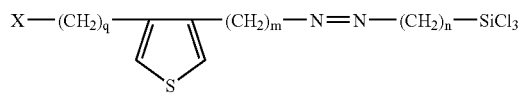 (E)

where, in the chemical formulae (B) to (E),

X represents one of hydrogen, an organic group containing an ester group, and an organic group containing an unsaturated group, q represents an integer of 0 to 10, and m and n represent integers of 1 to 20.

When the chemical compound expressed by the chemical formula (D) is bound chemically with the substrate and the conductive conjugate groups are polymerized, a compound expressed by a chemical formula (F) below is obtained:

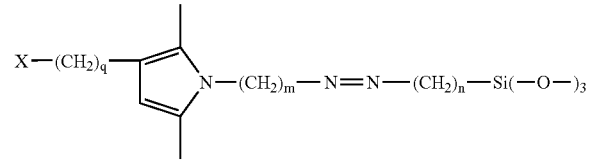 (F)

Furthermore, when the chemical compound expressed by the chemical formula (E) is bound chemically with the substrate and the conductive conjugate groups are polymerized, a compound expressed by a chemical formula (G) below is obtained:

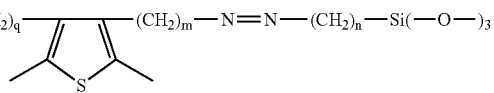 (G)

In the case where X in the chemical formula (F) or (G) contains an ester group, a —OH group can be introduced by hydrolyzation. In the case where X contains an unsaturated group such as a vinyl bond, a —OH group can be introduced by, for instance, projecting an electron beam or X rays in an atmosphere in which moisture is present. In the case where X contains an unsaturated group such as a vinyl bond, a —COOH group can be introduced by, for instance, immersing the film in a potassium permanganate aqueous solution. By so doing, active hydrogen can be introduced, whereby a monomolecular film can be built up further.

The organic molecules may be formed in a monomolecular layer. Further, the monomolecular layer forming step is repeated a plurality of times so as to laminate the monomolecular layers, thereby forming a monomolecular build-up film.

Furthermore, after the monomolecular layer forming step and the tilting step are repeated alternately, the conductive networks may be formed simultaneously in respective monomolecular layers in a monomolecular build-up film in the conductive network forming step, so that a conductive monomolecular build-up film is formed.

A series of the monomolecular layer forming step, the tilting step, and the conductive network forming step may be repeated so that a conductive monomolecular build-up film is formed.

Further, upon the formation of the conductive network by polymerization, polymerization of at least one type selected from catalystic polymerization, energy beam polymerization, and electrolytic oxidation polymerization is carried out.

The energy beam preferably is at least one selected from ultraviolet rays, far-ultraviolet rays, X-rays, and an electric beam.

The energy beam may be at least one selected from polarized ultraviolet rays, polarized far-ultraviolet rays, and polarized X-rays, and the tilting step and the conductive network forming step may be carried out simultaneously.

Some types of the conductive networks have a conductivity that varies when the organic thin film is irradiated with light. In this example, it is possible to control the variation of the conductivity of the conductive network by adjusting the energy of light absorbed in the organic thin film according to an intensity of light irradiated or a period of irradiation. Generally, since photoresponsive functional groups have respective specific absorption characteristics in the absorption spectrum, the use of light with a wavelength to which the photoresponsive functional group used has a high absorptance allows for efficient and high-speed variation of the conductivity.

When a first light having a wavelength that a photoresponsive functional group absorbs is projected, the conductivity of the conductive network contained in the conductive organic thin film varies from an initial conductivity to a first conductivity. Here, the initial conductivity is a conductivity of the conductive network before the light is projected thereto. Further, it is possible to change the conductivity of the conductive network to a certain conductivity between the initial conductivity and the first conductivity by adjusting a quantity of the projected first light by adjusting an intensity of the light or a period of irradiation.

When a second light having a wavelength that the photoresponsive functional group absorbs and that is different from that of the first light is projected, the conductivity of the conductive network varies from the first conductivity to a second conductivity. Here, it is possible to change the conductivity of the conductive network to a certain conductivity between the first conductivity and the second conductivity by adjusting a quantity of the second light.

Thus, by using the first and second lights, the conductivity of the conductive network contained in the organic thin film can be switched. In the switching operation, it is possible to perform not only the switching between a stable state having the first conductivity and a stable state having the second conductivity, but also the switching between states having different conductivities that are certain conductivities between the first and second conductivities.

Since the organic molecules composing a conductive monomolecular layer generally are in a highly aligned state, consequently conjugate bond chains of the conductive network are present in a specific plane. Therefore, the conductive network formed in the monomolecular layer linearly ranges in a predetermined direction. The linearity of the conductive network provides a high conductivity anisotropy. Further, the linearity of the conductive network indicates that conjugate bond chains (conjugated systems) composing the conductive network are arrayed substantially in parallel in the same plane within the monomolecular layer. Therefore, the conductive monomolecular layer has a high and uniform conductivity. Furthermore, the linearity of the conductive network causes conjugate bond chains with a high degree of polymerization to be present in a monomolecular layer.

According to the foregoing example, it is possible to provide a conductive monomolecular film and a conductive monomolecular guild-up film with a significantly enhanced conductivity even if it has a small film thickness. Further, such a film exhibits a significantly quick variation of the conductivity.

In the case of a conductive monomolecular build-up film, since conductive networks are formed in respective conductive monomolecular layers, the conductivity of the conductive network of the monomolecular build-up film depends on the number of monomolecular films thus stacked. Therefore, it is possible to provide a conductive organic thin film having a desired conductivity by changing the number of the conductive monomolecular layers composing the film. For instance, in the case of a conductive build-up film obtained by stacking same conductive monomolecular layers, the conductivity of the conductive network included therein is substantially proportional to the number of layers.

As long as the directions of the conductive networks formed in the monomolecular layers are uniform in the conductive monomolecular guild-up film, respective tilt angles of aligned organic molecules in the monomolecular layers may be different from one layer to another. Further, all the monomolecular layers need not be composed of the same organic molecules. Still further, the conductive monomolecular build-up film may be composed of conductive monomolecular layers in which respective types of organic molecules forming the conductive monomolecular layers are different from one layer to another.

Further, in the case of a conductive monomolecular build-up film, the conductive monomolecular layer closest to the substrate preferably is bound to the substrate by chemical bonds, since it provides excellent durability such as excellent spalling resistance.

According to another example of the manufacturing method of the present invention, it is possible to manufacture a photoresponsive conductive organic thin film having a conductive network with a directivity. Generally, in some cases, the direction of a conductive network coincides with a tilting direction of organic molecules composing an organic thin film having been subjected to a tilting process. The direction need not coincide with a tilting direction of the organic molecules, as long as a conductive network having a directivity is formed.

Herein, the tilting direction of organic molecules in the tilting step is defined as a direction of a line segment obtained by projecting a major axis of an organic molecule to a surface of the substrate. Therefore, the tilting angles with respect to the substrate need not be uniform.

According to the foregoing example, it is possible to form an organic thin film having a monomolecular layer. Further, in the tilting step, it is possible to tilt an aggregate of organic molecules composing the monomolecular layer with high accuracy in a predetermined direction. Generally, it is possible to align molecules composing a monomolecular layer. Furthermore, with accurate alignment, it is possible to form a conductive network having a directivity in the conductive network forming step easily.

Furthermore, by binding aligned organic molecules in the monomolecular layer by conjugated bonds, it is possible to form a conductive network having a high degree of polymerization and linearly ranging. Furthermore, with the directivity of the conductive network, it is possible to form a homogeneous conductive monomolecular layer.

According to the foregoing example, it is possible to tilt the organic molecules composing the organic thin film readily. Further, in the case where the organic thin film is a monomolecular film or a monomolecular build-up film, it is possible to align each monomolecular layer accurately. With the monomolecular layer thus aligned accurately, a conductive network with a conjugated system with a high degree of polymerization can be formed in the conductive network forming step.

In the foregoing example, a polarized light having a wavelength in a range of visible light is used as the polarized light. According to this example, the spalling of the organic molecules composing the organic thin film, and breakdown of the organic thin film due to breakdown of organic molecules themselves can be prevented or minimized.

According to the foregoing example, in the case where the organic thin film is formed on a surface of the substrate having been subjected to a rubbing process, the organic molecules composing the organic thin film exhibit a state of being tilted in a predetermined direction. Generally, a rubbing direction in the rubbing process and a tilting direction of the organic molecules of a film formed coincide with each other.

According to the foregoing example, a cloth made of nylon or rayon can be used as a rubbing cloth used in the rubbing process. As in the configuration described above, the use of a rubbing cloth made of nylon or rayon is suitable for the purpose of improving the accuracy of the alignment.

In the present invention, in the foregoing tilting step, after the substrate on which the organic thin film is formed is immersed in a washing liquid so that a surface of the organic thin film is washed, the substrate may be lifted up at a predetermined angle with respect to a liquid level of the washing liquid so that the draining of the washing liquid after the washing is carried out in a predetermined direction, whereby the organic molecules composing the organic thin film are tilted. In this example, the organic molecules composing the organic thin film can be tilted readily. Further, in the case where the organic thin film is a monomolecular film or a monomolecular build-up film, each monomolecular layer can be aligned. Generally, the draining direction and the tilting direction of organic molecules composing the organic thin film coincide with each other.

The foregoing angle may be a right angle with respect to the liquid level of the washing liquid.

In the foregoing example, the lifting structure is simplified, and the draining can be performed in a predetermined direction readily.

One or more types of polymerization methods may be applied in the foregoing conductive network forming step, so that the molecules composing the organic thin film are polymerized, or polymerized and linked after the polymerization, by conjugated bonds, whereby the conductive network is formed. In this example, a conductive network that allows for electric conduction can be formed by binding the polymerizable groups of the organic molecules by conjugated bonds. As the polymerization method, at least one selected from electrolytic polymerization, catalystic polymerization, and energy beam polymerization can be used.

Furthermore, before the conductive network is formed by the electrolytic oxidation, at least one type of preliminary polymerization selected from catalystic polymerization or energy beam polymerization may be performed.

Furthermore, in the case where each of the molecules forming the organic thin film has a plurality of polymerizable groups that are bound by conjugated bonds, a linking reaction is caused further in a polymer formed by polymerization of the polymerizable groups of one of the two kinds, so that the polymerizable groups of the other kind are bound by conjugated bonds. By so doing, a conductive network having a structure different from that after the polymerization can be formed. Here, the polymerizable groups of the other kind that are present in side chains of the polymer formed by the polymerization are linked with one another.

For instance, a monomolecular film is formed with an aggregate of organic molecules each having a diacetylene group, the monomolecular film is subjected to catalystic polymerization, and further, it is subjected to the energy beam polymerization for linking. By so doing, a conductive network including a polyacene-type conjugate system having an extremely high conductivity can be formed.

In the foregoing step of polymerization, the polymerization method selected from the group consisting of catalystic polymerization, electrolytic polymerization, and energy beam polymerization may be applied. In this example, a conductive network can be formed by applying catalystic polymerization to an organic thin film composed of organic molecules having polymerizable groups with catalyst polymerizability (hereinafter referred to as catalyst-polymerizable group), by applying the electrolytic polymerization to an organic thin film composed of organic molecules having polymerizable groups with electrolytic polymerizability (hereinafter referred to as electrolytic-polymerizable group), or by applying the energy beam polymerization to an organic thin film composed of organic molecules having polymerizable groups that are polymerized when being irradiated with an energy beam (hereinafter referred to as energy-beam-polymerizable group).

The linking step preferably is at least one linking step selected from the group consisting of the linking step by catalystic polymerization, the linking step by electrolytic polymerization, and the linking step by energy beam polymerization.

Furthermore, a method in which the reaction is completed finally by electrolytic oxidation polymerization is available.

In the foregoing configuration, even in the case where a polymer after the polymerization has a plurality of kinds of binding groups with different linking properties, a conductive network can be formed by carrying out a linking step a plurality of times. Further, the polymerization method such as the catalyst effect, the electrolytic effect, or the energy beam effect can be used for the linking.

Examples of the set of plural linking steps include not only a combination of linking steps by different effects, but also a combination of steps by the same effect under different reaction conditions. For instance, a conductive network may be formed by carrying out a linking step by projecting an energy beam of a first type after the linking step by the catalyst effect, and thereafter, carrying out a linking step by projecting an energy beam of a second type.

In the foregoing conductive network forming step, the catalystic polymerization is applied as the polymerization method, and a conductive network is formed in an organic thin film that is formed with an aggregate of organic molecules having pyrrole groups, thienyl groups, acetylene groups, or diacetylene groups, as the polymerizable groups.

In the foregoing example, a conductive network including a polypyrrole-type conjugate system, a polythienylene-type conjugate system, a polyacetylene-type conjugate system, a polydiacetylene-type conjugate system, or a polyacene-type conjugate system can be formed by using organic molecules having pyrrole groups, thienyl groups, acetylene groups, or diacetylene groups.

By applying the electrolytic polymerization in the foregoing conductive network forming step, a conductive network can be formed in an organic thin film that is formed with an aggregate of organic molecules having pyrrole groups or thienyl groups as the polymerizable groups.

In the foregoing example, by using the organic molecules having pyrrole groups or thienyl group as the organic molecules forming the organic thin film, a conductive network can be formed that includes a polypyrrole-type conjugate system or a polythienylene-type conjugate system.

In the foregoing conductive network forming step, it also is possible to form a conductive network by the energy beam polymerization in the organic thin film formed with an aggregate of organic molecules having acetylene groups or diacetylene groups as the polymerizable groups. In this example, a conductive network having a polyacetylene-type conjugate system can be formed by using organic molecules having acetylene groups as the organic molecules composing the organic thin film. On the other hand, a conductive network having a polydiacetylene type conjugate system or a polyacene-type conjugate system can be formed by using organic molecules having diacetylene groups as the organic molecules composing the organic thin film.

Ultraviolet rays, far-ultraviolet rays, X-rays, or an electric beam may be used as the foregoing energy beam. In this example, a conductive network can be formed efficiently. Further, since the absorption characteristics are different according to the type of the beam-irradiation-polymerizable groups, the reaction efficiency can be enhanced by selecting a type of an energy beam and energy that allow for the improvement of the absorption efficiency. Furthermore, since many beam irradiation polymerizable groups exhibit absorbing properties with respect to such energy beams, it is applicable to organic thin films formed with organic molecules having various types of beam-irradiation-polymerizable groups.

Furthermore, polarized ultraviolet rays, polarized far-ultraviolet rays, or polarized X-rays may be used as the foregoing energy beam, and the tilting step and the conductive network forming step may be carried out simultaneously. In this example, the organic molecules forming an organic thin film can be tilted in a predetermined direction (aligned), and the organic molecules can be bound with one another via conjugated bonds. Therefore, the process can be simplified.

Furthermore, it is possible to provide a two-terminal organic photoelectronic device in which a channel part electrically connecting a first electrode and a second electrode is formed with a conductive organic thin film, and a conductivity between the first electrode and the second electrode (hereinafter referred also to as paired electrodes) varies in response to irradiation of the conductive organic thin film with light. Further, in the case where the organic molecules composing the conductive thin film have photoresponsive functional groups, the thin film has a high sensitivity with respect to light projected thereto, and has a high responding speed. Therefore, it is possible to provide a fast organic photoelectronic device with a high-speed variation of conductivity between the paired electrodes. Hereinafter it is assumed that in the organic photoelectronic device the conductivity of the conductive network is equivalent to the conductivity between the paired electrodes.

A maximal conductivity between the paired electrodes is obtained when the first and second electrodes are arrayed in a direction of the conductive network, whereas a minimal conductivity therebetween is obtained when they are arrayed in a direction orthogonal to the direction of the conductive network. By forming the first and second electrodes in a manner such that a maximal conductivity is obtained, it is possible to provide a two-terminal organic photoelectronic device that exhibits wide-range conductivity variation.

By adjusting the paired electrode arranging direction when the first and second electrodes are arranged, the conductivity between the electrodes can be adjusted. Further, the conductivity variation range can be adjusted by adjusting the size of the electrode or adjusting a distance between the paired electrodes.

The conductivity of the conductive network may vary with a quantity of light projected to the conductive organic thin film. In this example, energy of light absorbed in an organic thin film may be adjusted by adjusting an intensity of projected light or a period of light projection, whereby the conductivity between the paired electrodes can be varied. Further, by utilizing the characteristic of the conductivity variation, an organic photoelectronic device such as a variable resistor can be provided.

Generally, since photoresponsive functional groups have respective specific absorption characteristic in the absorption spectrum, the use of light with a wavelength to which the photoresponsive functional group used has a high absorptance allows for efficient and high-speed variation of the conductivity.

The conductive network may be configured so as to have a conductivity such that a transition is made to a first conductivity or to a second conductivity in response to a first light or a second light projected to the conductive organic thin film, respectively, the first and second lights having different wavelengths, and that the first or second conductivity is maintained even after the light is no longer projected thereto. According to this example, by projecting the first or second light in a state in which a voltage is applied across the paired electrodes so as to make a transition between a stable state with the first conductivity and a stable state with the second conductivity, the switching of the conductivity of the conductive network is enabled. Further, a memory function is provided since the stable states are maintained even when the projection of light is stopped. Therefore, it is possible to provide an organic photoelectronic device such as an optical variable resistor, an optical switching element, an optical memory element, or an optical sensor.

Furthermore, since the first conductivity or the second conductivity depends on a state before light is projected or a quantity of the first light or the second light projected, the respective conductivities of the stable states can be varied and controlled by adjusting the light intensity or the period of light projection.

The photoresponsive functional group may be a photoisomerizable functional group. In this example, stable states having the first and second conductivities can be provided by isomerization. Further, this enables extremely fast control of the conductivity of the conductive network. Here, a stable state in which the conductive network has a stable and predetermined conductivity suffices as the foregoing stable state. For instance, a conductivity that the conductive network exhibits when the first and second isomers are present at a certain ratio is a first conductivity, and this state is a stable state with the first conductivity.

The photoisomerizable functional group may be an azo group. According to this example, the conductivity of the conductive network varies, according to the isomerization to a first isomer of a trans type in response to irradiation of visible light, or the isomerization to a second isomer of a cis-type in response to irradiation of ultraviolet rays.

The substrate may be a substrate with an electric insulation property made of glass, a resin film, etc., or an insulation-film-formed substrate obtained by forming an insulation film on a surface of a certain substrate. In the case where the substrate is made of glass or a polyimide resin, it can be used as it is, since it has active hydrogen on its surface. In the case of a substrate with less active-hydrogen, active hydrogen is provided to the substrate by treating the same with $SiCl_4$, $HSiCl_3$, $SiCl_3O$—$(SiCl_2$—$O)_n$—$SiCl_3$ (where n is an integer of not less than 0 and not more than 6), $Si(OH)_4$, $HSi(OH)_3$, or $Si(OH)_3O$—$(Si(OH)_2$—$O)_n$—$Si(OH)_3$ (where n is an integer of not less than 0 and not more than 6), or by forming a silica film thereon, or alternatively, by activating the substrate surface by corona discharge, plasma projection, etc.

In the case where the substrate is an electric insulation material, it is possible to provide an organic photoelectronic device with minimized current leakage and excellent operation stability.

The organic conductive film of the present invention has high conductivity, and high transparency. The organic conductive thin film can be applied for various uses in which these characteristics are utilized, for instance, electric wires, motors, power generators, capacitors, transparent electrodes (substitutes for ITO), electric lines in semiconductor devices and CPUs (with less heat generation due to electric resistance), electromagnetic interference shield materials, and CRT glass surface filter (inhibiting static electricity generation).

EMBODIMENT 1

Figure 1B:
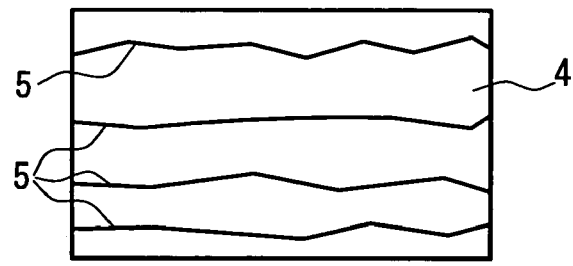
FIG. 1B is a plan view of the same.

As Embodiment 1, a method of producing a conductive monomolecular film and a structure thereof, in which a conductive monomolecular film is employed as an example, will be described below with reference to FIGS. 1 to 4. FIG. 12 is a conceptual view illustrating a tilting direction of organic molecules. FIGS. 1A and 1B are conceptual magnified views of a conductive monomolecular film formed on a substrate, magnified to a molecular level. FIG. 1A is a cross-sectional view of the film, and FIG. 1B is a plan view of the same.

(1) Step of Fixing Organic Molecules with Respect to a Surface of a Substrate:

First, a monomolecular film 4 composed of organic molecules is formed on a substrate 1, each of the molecules having a photoresponsive functional group (for instance, azo-bond group (—N═N—)) 7 that does not include active hydrogen and a polymerizable group 5 that is to be conjugated (film forming step, monomolecular layer forming step). In the case where the photoresponsive functional group includes active hydrogen, an intramolecular reaction (self-condensation) takes place with a chlorosilyl group at an end of a molecule that will be described below, which is inconvenient.

In the case where the molecule is an organic molecule having at an end a functional group that is adsorbed chemically to a substrate, for instance, a molecule of a silane-based surfactant that has a chlorosilyl group or an alkoxysilyl group at an end, the molecules are bonded and fixed to the substrate by an elimination reaction, whereby a monomolecular film with excellent spalling resistance and durability can be formed. Furthermore, a washing step in which the film-formed substrate is immersed in an organic solvent so that organic molecules not adsorbed are removed (hereinafter referred to as washing step) may be performed after the monomolecular layer forming step, so that a monomolecular film 4 without contaminant on its surface is formed.

(2) Alignment Step

Next, the organic molecules composing the monomolecular film are tilted in a predetermined direction (tilting step). A monomolecular film or a monomolecular layer is aligned by tilting the organic molecules composing the monomolecular film in a predetermined direction (this step is hereinafter referred to as "alignment" with respect to the monomolecular film and the monomolecular layer).

(i) Rubbing Process

Figure 2:
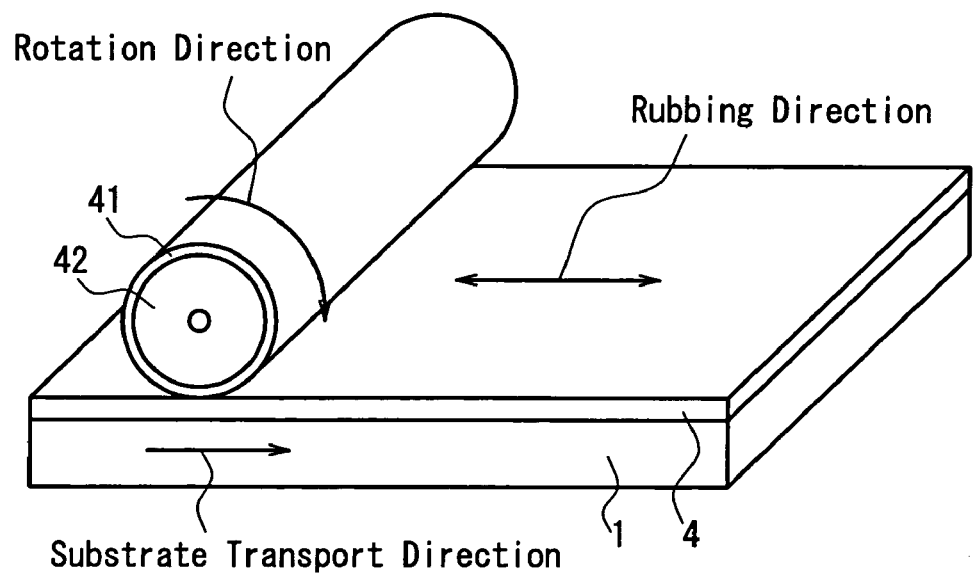
FIG. 2 is a conceptual view for explaining a rubbing alignment process according to Embodiment 1 of the present invention.

In the tilting step, as shown in FIG. 2, rubbing is performed with respect to a surface of the monomolecular film using a rubbing device, so that the organic molecules composing the monomolecular film are aligned in the rubbing direction. In FIG. 2, 41 denotes a rubbing cloth, and 42 denotes a rubbing roll.

(ii) Polarization Process

Figure 3:
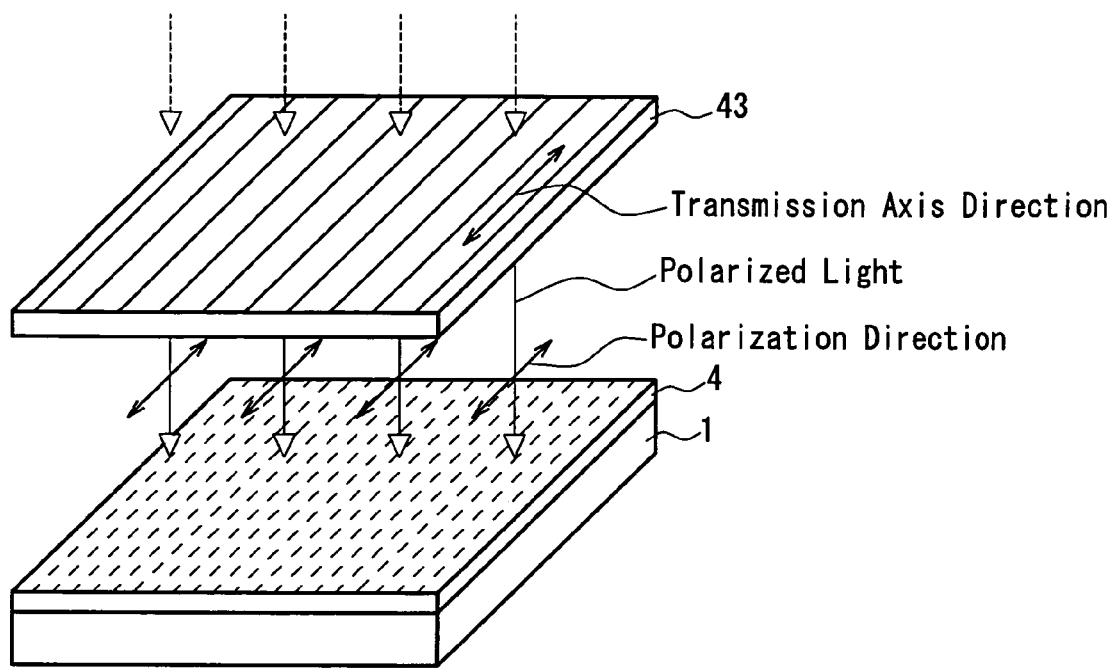
FIG. 3 is a conceptual view for explaining an optical alignment process according to Embodiment 1 of the present invention.

As shown in FIG. 3, polarized light is projected using a polarization plate 13 so that the organic molecules composing the monomolecular film 4 are aligned in a polarizing direction. As the polarized light, linearly polarized light is preferable. By applying this aligning method, accurate alignment can be achieved.

Furthermore, the rubbing process may be applied to a surface of the substrate using a rubbing device before the monomolecular layer is formed (preprocessing step). By so doing, in the monomolecular film forming step, an aligned monomolecular film can be formed on the substrate having been subjected to rubbing. Here, the alignment direction is the same as the rubbing direction.

(iii) Draining Alignment Process

Figure 4:
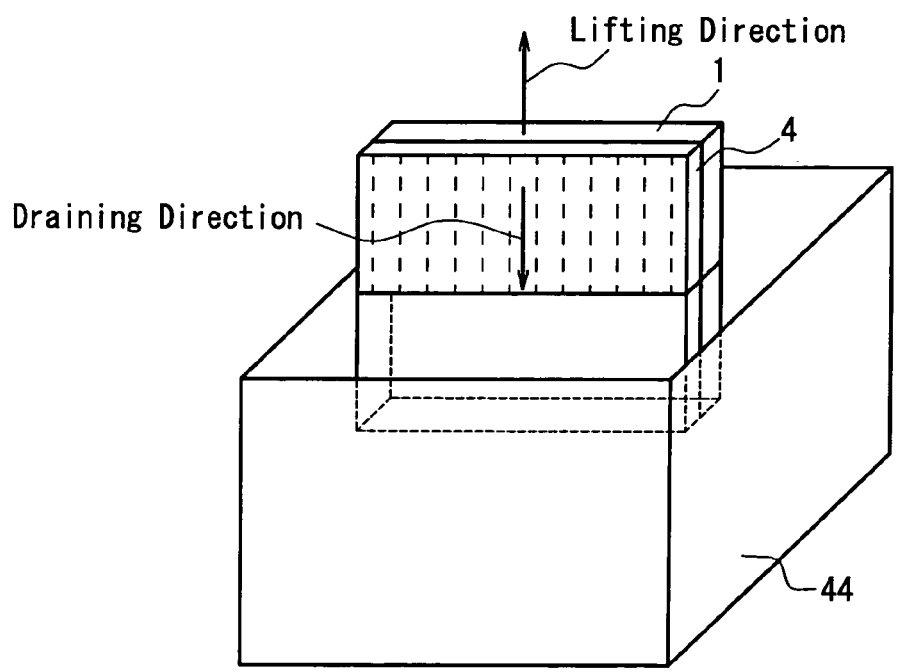
FIG. 4 is a conceptual view for explaining a lifting alignment process according to Embodiment 1 of the present invention.

After the non-adsorbed organic molecules are removed in the foregoing washing step, the substrate may be lifted up while being tilted at a predetermined tilt angle with respect to a liquid level of the organic solvent 44 as shown in FIG. 4, so that the organic molecules composing the monomolecular film are aligned in a direction in which the solvent is drained (hereinafter referred to as "draining alignment").

Each of the foregoing three methods for alignment may be used alone or a plurality of the same may be used in combination. In the case where different aligning methods are used in combination so as to form an aligned monomolecular film in an accurately aligned state, it is preferable that the rubbing direction, the polarization direction, and the draining direction coincide with one another.

(3) Step of Forming a Conductive Network

Next, a conductive network is formed by binding the molecules composing the monomolecular film with one another by conjugated bonds.

The method applied herein may be any method as long as a conjugated system is formed by polymerization of polymerizable groups that can be bound with one another by conjugated bonds. The conjugated system can be formed by polymerizing or linking molecules that compose the monomolecular film. Examples of applicable polymerizing methods include catalystic polymerization, electrolytic polymerization, energy beam polymerization, etc., through which the polymerization or linking is carried out. Among these, the catalystic polymerization and the energy beam polymerization, when used for forming a preliminary network, ensure efficient network formation because of their high polymerization rate.

In the case where the conjugatable group is an ethynyl group (including the case of an acetylene group), the catalystic polymerization and/or the electron beam polymerization may be applied so that polyacetylene is formed by polymerization.

In the case where the conjugatable group is a diethynyl group (including the case of a diacetylene group), the catalystic polymerization and/or photopolymerization may be applied so that polydiacetylene or polyacene is formed by polymerization.

In the case where the conjugatable group is a pyrrole group or a thiophene group, the catalystic polymerization and/or electrolytic oxidation polymerization may be applied so that polypyrrole or polythiophene is formed by polymerization. It is preferable that the electrolytic oxidation polymerization is carried out in particular at the final step in forming the conductive network. For instance, the electrolytic oxidation polymerization may be performed at a reaction temperature of approximately room temperature (25° C.), without catalyst, by applying an electric field in a pure-water solution. It is possible also to raise or lower the reaction temperature, to use a catalyst, and to use a solution other than an aqueous solution as required. In the electrolytic oxidation polymerization in which an electric field is applied across electrodes, whether a conductive network is completed can be judged easily by observing the state of conductivity between the electrodes. In other words, when a conductive network is completed, a phenomenon of abrupt flow of current through a film between the electrodes can be observed.

Furthermore, the conductive network may be formed by carrying out the polymerizing or linking step a plurality of times. For instance, in the case where organic molecules, each of which having a plurality of polymerizable groups that are conjugated with one another, are used as a material for forming a film, a conductive network can be formed over a plurality of planes included in a monomolecular layer composed of the organic molecules. Furthermore, in the case where the polymerization or the linking is carried out a plurality of times, different polymerizing methods may be applied at respective times.

Furthermore, in the case where the organic molecules composing the monomolecular film have energy-beam-polymerizable groups, projection of polarized light makes it possible to form a conductive network while aligning the monomolecular film at the same time.

Through the foregoing series of steps, the photoresponsive conductive monomolecular film 4 is produced that is a monomolecular film composed of an aggregate of organic molecules each having the photoresponsive functional group 7, and that includes a conductive network 5 in which the molecules composing the organic molecule set are bound with one another by conjugated bonds, so as to range in a predetermined direction.

EMBODIMENT 2

A method for producing a photoresponsive conductive organic thin film and a structure of the same in the case where the photoresponsive conductive organic thin film is a photoresponsive monomolecular build-up film will be described below as an embodiment of the present invention. FIGS. 5A to 5D are referred to as required.

First of all, a method for producing a conductive monomolecular build-up film is described. Mainly the following three methods are available for forming a conductive monomolecular build-up film.

(1) The first producing method is such that a step for forming a monomolecular layer is carried out repetitively so that monomolecular layers are laminated, and thereafter the monomolecular layers are aligned in a predetermined direction at once, which is followed by formation of a conductive network in each of the monomolecular layers.

(2) The second producing method is such that a step for forming a monomolecular layer and a subsequent step of aligning the monomolecular layer are carried out repetitively so that an aligned monomolecular build-up film is formed, and thereafter, a conductive network is formed in each of the monomolecular layers in the aligned monomolecular build-up film simultaneously.

(3) The third producing method is such that a step of forming a monomolecular layer, aligning the monomolecular layer, and subsequently forming a conductive network in the monomolecular layer is carried out repetitively.

As the method for aligning a monomolecular layer and the method for forming a conductive network in a monomolecular layer, those methods described in conjunction with Embodiment 1 can be used in the same manners. However, the alignment process is only effective when it is applied before the polymerization.

The foregoing three producing methods preferably are optimized depending on how the monomolecular layer is to be aligned, how the conductive network is to be formed, etc. Furthermore, the producing method preferably is selected depending on how many conductive monomolecular layers are to be laminated to form a conductive monomolecular build-up film, etc.

In the case where a conductive monomolecular build-up film composed of many layers laminated is to be formed, the second or third producing method preferably is used.

In the case where the first producing method is used, it is preferable that the optical alignment process or the rubbing process is used as the alignment process, and that the energy beam polymerization process or the electrolytic polymerization process is used as the polymerization process. Furthermore, as the number of laminated layers increases, the optical alignment process is effective as the alignment process. In the case where the catalystic polymerization process is used, it becomes difficult to form conductive networks in monomolecular layers in a lower part on the substrate side.

The foregoing matters regarding the first producing method apply also to the case where the second producing method is used, but since the step for alignment increases, the optical alignment process is preferable as the alignment process (tilting step) because it provides simplification.

In the case where the third producing method is used, all the alignment processes and all the polymerization processes are applicable. Since it involves many steps, the production efficiency deteriorates and the production cost rises, but a conductive monomolecular build-up film is formed that is composed of monomolecular layers with high conductivities that are highly uniform.

Through the foregoing series of steps, a photoresponsive conductive monomolecular build-up film is produced that is a monomolecular build-up film composed of an aggregate of organic molecules each having a photoresponsive functional group, and that includes a conductive network in which the molecules composing the organic molecule set are conjugated with one another so as to range in a predetermined direction.

Figure 5A:
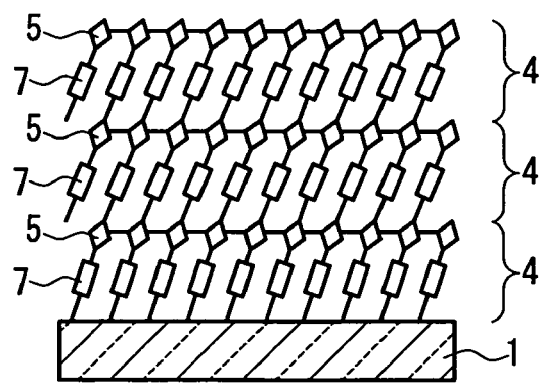
FIGS. 5A to 5D are conceptual magnified views illustrating examples of structures of a conductive monomolecular build-up film according to Embodiment 2 of the present invention, which are magnified to a molecular level.
Figure 5B:
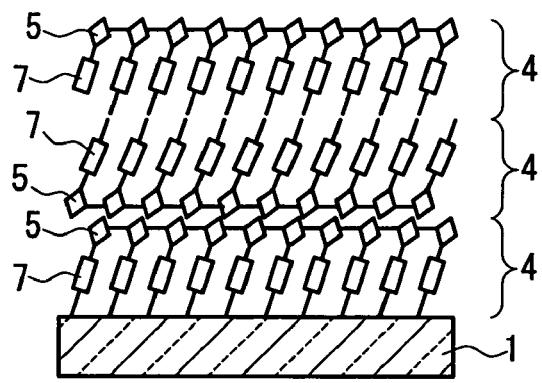
Figure 5C:
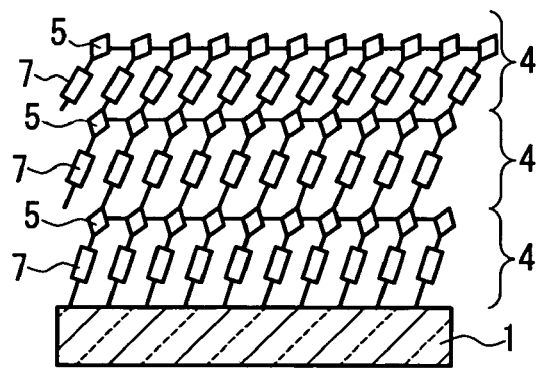
Figure 5D:
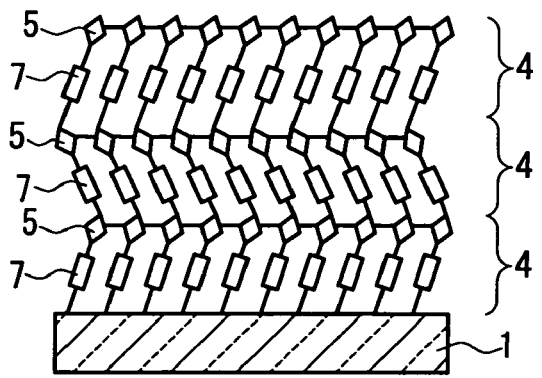

The following will describe an example of a structure of a conductive monomolecular build-up film formed as described above, while referring to FIGS. 5A to 5D. FIGS. 5A to 5D are conceptual magnified views of a conductive monomolecular build-up film, magnified to a molecular level. FIG. 5A is a cross-sectional view of an X conductive monomolecular build-up film that is formed by chemisorption and in which respective alignment directions of the monomolecular layers are uniform. FIG. 5B is a cross-sectional view of a Y conductive monomolecular build-up film in which a first layer directly formed on a substrate is a chemisorption film and layers other than the first layer compose a build-up film formed by the Langmuir-Blodgett technique, and in which respective alignment directions of the monomolecular layers are uniform. FIG. 5C is a cross-sectional view of an X conductive monomolecular build-up film in which respective alignment directions of the monomolecular layers are different. FIG. 5D is a cross-sectional view of an X conductive monomolecular build-up film in which each monomolecular layer has either one of two alignment directions.

In FIGS. 5A to 5D, 1 denotes a substrate, 4 denotes a monomolecular layer, 5 denotes a conductive group of a conjugated bond, and 7 denotes a photoresponsive functional group. Plan views of the monomolecular layers 4 of the respective conductive monomolecular build-up films shown in FIGS. 5A to 5D are identical to the plan view of FIG. 1B.

EMBODIMENT 3

A method for producing a two-terminal organic photoelectronic device and a structure of the device are described with reference to FIGS. 6A and 6B. FIGS. 6A and 6B are explanatory views schematically illustrating an example of a structure of the two-terminal organic photoelectronic device.

First of all, a monomolecular film composed of an aggregate of organic molecules each having a photoresponsive functional group 7 and a polymerizable group 5 that is to be bound by a conjugated bond is formed on an insulation substrate or on an insulation-film-formed substrate 1 obtained by forming an insulation film on a surface of a certain substrate. Then, the monomolecular film is aligned, and the molecules composing the monomolecular film are bound with one another by conjugated bonds so as to form a conductive network 5. A first electrode 2 and a second electrode 3 are formed separately from each other so as to be in contact with the conductive network 5. By so doing, a two-terminal organic photoelectronic device is produced.

Thus, it is possible to provide the two-terminal organic photoelectronic device that includes the first electrode 2 and the second electrode 3 formed separately from each other on the substrate, and the conductive monomolecular film 4 that electrically connects the first electrode 2 and the second electrode 3. In the device, the conductive monomolecular film 4 is composed of an aggregate of organic molecules each having a photoresponsive functional group, and in which the molecules forming the organic molecule set are bound with one another by conjugated bonds so as to form the conductive network 5.

FIG. 6A illustrates a two-terminal organic photoelectronic device having a structure in which a first electrode 2 and a second electrode 3 are in contact with a surface of a substrate 1 and side faces of a conductive monomolecular film 4. FIG. 6B illustrates a two-terminal organic photoelectronic device having a structure in which a first electrode 2 and a second electrode 3 are formed on a surface of a conductive monomolecular film 4. The first electrode 2 and the second electrode 3 may be formed by applying materials for forming the electrodes by vapor deposition and then etching the same with use of a mask pattern formed with a photoresist. In this case, the two-terminal organic photoelectronic devices having structures shown in FIGS. 6A and 6B can be produced by using different mask patterns, respectively.

With the structure shown in FIG. 6A, organic molecules each having a polymerizable group at a certain position within each molecule can be used, and a plurality of conductive networks can be formed that electrically connects the first electrode 2 with the second electrode 3 even in the case where each organic molecule has a plurality of polymerizable groups. Furthermore, in the case where the organic thin film is a monomolecular build-up film, a conductive network can be formed in each of the monomolecular layers.

Furthermore, when a two-terminal organic photoelectronic device of this structure is produced, the foregoing electrode forming step may be carried out before the foregoing film forming step.

In the structure shown in FIG. 6B, if the conductive network is absent from a surface of the monomolecular film 4 on the side opposite to the substrate, electric conductivity between the conductive network 5 and the electrodes 2 and 3 deteriorates. Therefore, a material such that each molecule of the material has a polymerizable group at an end thereof is used preferably. In the case where such molecules are used, a large contact area is secured in which the conductive network 5 of the conductive monomolecular film 4 is brought in contact with the electrodes 2 and 3, which reduces the contact resistance. Thus, an advantage of securing excellent conductivity is achieved even in the case of a monomolecular film.

In the case where a further higher conductivity is required, a coating having a conductive network may be formed between the first electrode 2 and the second electrode 3. For example, after the foregoing electrode forming step, the substrate is immersed in an organic solvent in which a substance having an electrolytic-polymerizable functional group is dissolved, a first voltage is applied across the first electrode 2 and the second electrode 3, and a second voltage is applied across the first or second electrode 2 or 3 and an external electrode arranged in contact with the organic solvent and above the organic thin film. By so doing, a coating is formed further on a surface of a monomolecular film having a conductive network of a first structure, and molecules composing the coating are polymerized electrolytically, thereby forming a conductive network of a second structure.

Furthermore, upon the formation of the coating, a substance having an electrolytic-polymerizable functional group may be coated, and a voltage may be applied across the first electrode 2 and the second electrode 3. By so doing, a polymer-film-like coating having a conductive network can be formed likewise.

In the case where the organic thin film is configured so as not to include a monomolecular film in which organic molecules composing the organic thin film are arrayed in a monomolecular layer form, the structures shown in FIGS. 6A and 6B have such a difference as that described above therebetween.

Figure 7A:
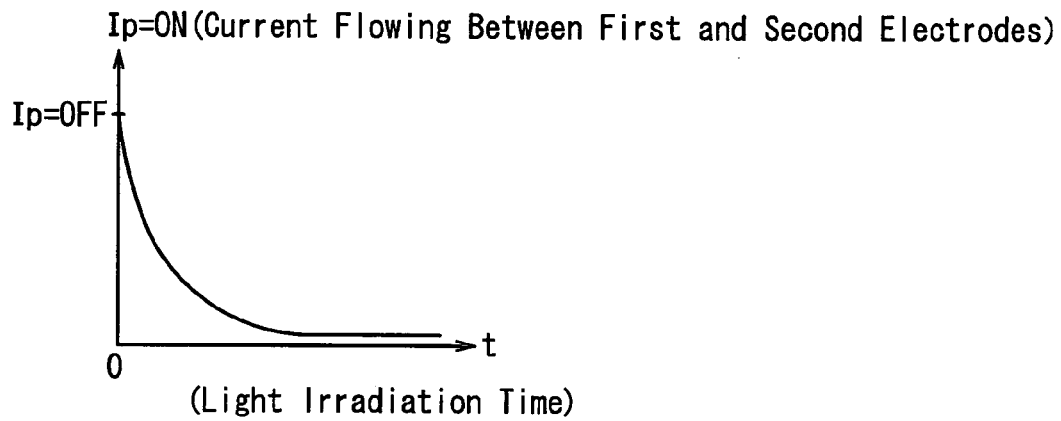
FIGS. 7A and 7B are conceptual views illustrating the variation of conductivity of the two-terminal organic photoelectronic device with respect to irradiation of light in Embodiment 3 of the present invention.
Figure 7B:
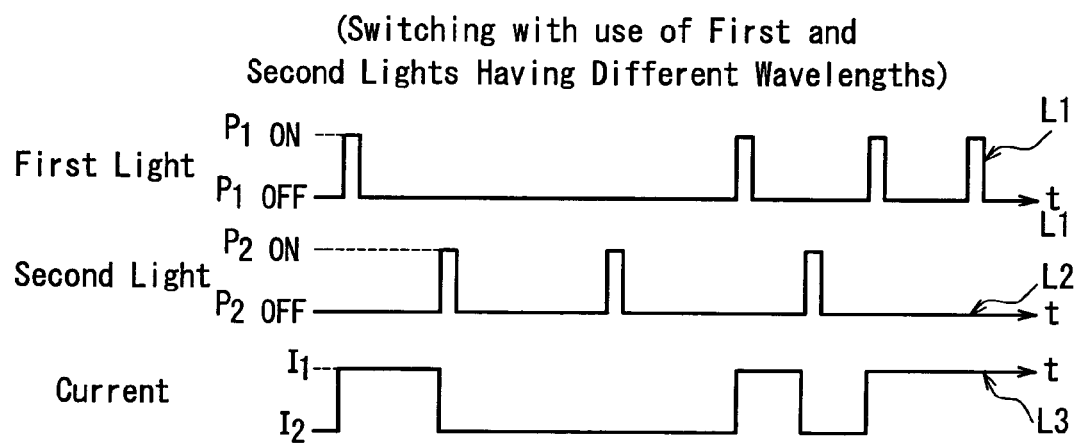

The following describes the variation with time of a conductivity and a switching operation of the two-terminal organic photoelectronic device upon irradiation of light, while referring to FIGS. 7A to 7B. FIG. 7A is a schematic view quantatively illustrating the variation of the conductivity with time of irradiation in the case where the organic thin film is irradiated with light with a uniform intensity.

Assuming that a quantity of light irradiated is proportional to a product of an intensity of the light irradiated and a time of irradiation, the following three are equivalent to one another: the quantity of light projected to the organic thin film is plotted as the horizontal axis; the time under the condition that the intensity of light is uniform is plotted as the horizontal axis; and, the intensity of light under the condition that the irradiation time is uniform is plotted as the horizontal axis. The following describes the case where the intensity of light is uniform. Further, the variation of conductivity is described as variation of electric current in a state in which a constant voltage is applied across the first electrode 2 and the second electrode 3.

The conductivity of the conductive network varies with the irradiation of light, and comes to have a certain value. Unlike the case shown in FIG. 7A, it may come to have an amperage of 0 A (0 ampere) after light has been projected during a sufficient time for variation. Furthermore, though FIG. 7A shows a case where the amperage decreases with irradiation of light, the organic thin film may be configured so that the amperage increases with irradiation of light. This depends on the constituent substances and structure of the organic thin film, the structure of the conductive network, etc.

Next, FIG. 7B is a conceptual view illustrating a switching action of the device in which a photosensitive functional group is a photoisomerizable functional group. The switching action is caused by a transition between a stable state having a first conductivity and a stable state having a second conductivity. The transition is caused by isomerization caused by irradiation with a first light and a second light. Lines L1 and L2 in FIG. 7B represent a state with irradiation with the first light and the second light ($P_{1ON}$, $P_{2ON}$), and a state without irradiation with the first light and the second light ($P_{1OFF}$, $P_{2OFF}$), respectively. Line 3 in FIG. 7B represents a response of the device thereto, in which $I_1$ represents a current value in response to irradiation with the first light, and $I_2$ represents a current value in response to irradiation with the second light.

The drawing shows the action of switching current flowing between the first electrode 2 and the second electrode 3 in a state in which a voltage is applied across the first electrode 2 and the second electrode 3. It is determined from Line 3 in FIG. 7B that this is an action of switching current in response to the first light and the second light as a trigger, which is found to be the same action as that of a reset-set flip-flop (R-S flip-flop).

However, FIG. 7B shows a case where only one of different isomers is contained as a stable state having the first conductivity, and a case where only the other isomer is contained as a stable state having the second conductivity. More specifically, two completely isomerized states are the stable state having the first conductivity and the stable state having the second conductivity. In this case, even if the device in the first stable state is irradiated further with the first light, the conductivity does not change. Likewise, the conductivity does not change even if the device in the second stable state is irradiated further with the second light.

Thus, Embodiment 1 is described as above referring to an action of the device as a switching element for switching a current flowing between the first electrode and the second electrode. This device can be used as an optically controlled variable resistor, since the conductivity of the organic thin film varies in response to irradiation of light.

In the case of an organic thin film composed of an aggregate of molecules having photoisomerizable functional groups as photoresponsive functional groups, the film in a state in which a constant current flows between the first and second electrodes or a constant voltage is applied across the first and second electrodes is irradiated with first light or second light, and variation of a voltage applied across the first electrode 2 and the second electrode 3 or variation of a current flowing between the first electrode 2 and the second electrode 3 is read out. By so doing, the film is used as an optical sensor. Alternatively, by reading out the voltage variation or the current variation with time of irradiation, the film also can be used as a photodetector of an illuminometer. However, herein it is necessary to use one of the first light and the second light for initializing the state, so that the conductivity of the organic thin film is initialized using the light, after the film is irradiated with the other light.

Furthermore, the film makes a transition between two states of isomers caused by isomerization, and a state of an isomer obtained as a result of the transition is maintained after irradiation is stopped. Therefore, the film can be used as a memory element.

EXAMPLES

The following will describe the present invention in more detail, referring to examples. In the Examples described below, "%" alone means "percent by weight".

Example 1

The following will describe a two-terminal organic photoelectronic device having a photoresponsive conductive monomolecular film, while referring to FIGS. 8 to 11.

First, a chemisorption liquid was prepared by diluting a substance expressed by a chemical formula (1) shown below with a dehydrated dimethyl silicone solvent so as to obtain a 1% solution. The substance of the chemical formula (1) has an ethynyl group (—C≡C—) that forms a conjugated bond by polymerization to form a conductive network, an azo group (—N═N—) that is a photoisomerizable functional group, and a trichlorosilyl group (—SiCl$_3$) that reacts with active hydrogen (for instance, a hydroxy group (—OH)) on a substrate surface.

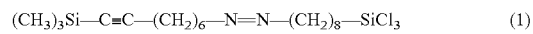

$(CH_3)_3Si$—C≡C—$(CH_2)_6$—N═N—$(CH_2)_8$—$SiCl_3$   (1)

Next, an insulation substrate 21 (glass substrate) that was covered with a resist except for a portion thereof where a monomolecular film was to be formed was immersed in the chemisorption liquid for one hour at room temperature (25° C.) so that dehydrochlorination occurred on the surface of the substrate, whereby a thin film was formed selectively at an opening in the resist. Then, any non-reacted part of the foregoing substance remaining on the substrate was removed therefrom by washing the substrate with a chloroform non-aqueous solution, and subsequently the mask pattern of the foregoing photoresist was removed. Thus, a monomolecular film 24a made of the foregoing substance was formed selectively.

Figure 8:
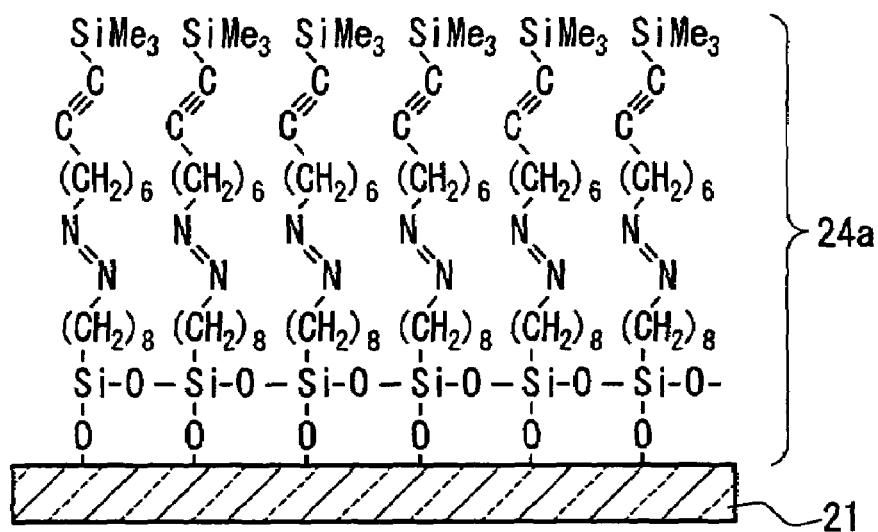
FIG. 8 is a conceptual magnified cross-sectional view of a substrate on which a monomolecular film is formed, which is magnified to a molecular level, for explaining a film forming step according to Embodiment 1 of the present invention.

Upon the formation of the thin film, since many hydroxy groups containing active hydrogen are present on a surface of the glass substrate 21 in the opening of the resist, dehydrochlorination of the trichlorosilyl group (—SiCl$_3$) of the foregoing substance with the hydroxy groups occurred, and the monomolecular film 24a expressed by a chemical formula (2) below was formed, which was bound with the surface of the substrate 21 by covalent bonds (FIG. 8).

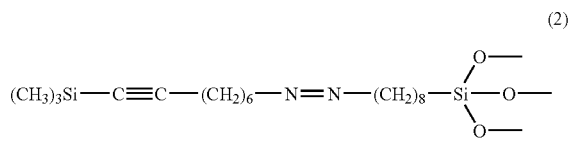

(2)

Next, using the rubbing device that is used for forming the liquid crystal alignment film, a rubbing operation was applied in a direction parallel with the direction from the first electrode 22 to the second electrode 23. Here, the rubbing was carried out using a 7-cm-diameter rubbing roll 42 around which a rubbing cloth 41 made of rayon (YA-20-R manufactured by Yoshikawa Chemical Co., Ltd.) was applied, under the conditions of a nip width of 11.7 mm, a roll revolution rate of 1200 revolutions/sec, and a table moving speed of 40 mm/sec.

Figure 9:
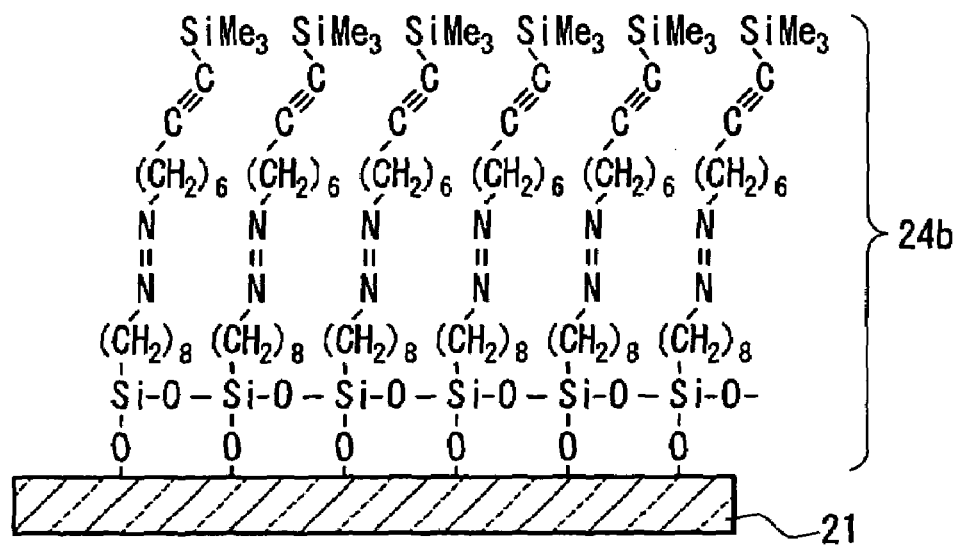
FIG. 9 is a conceptual cross-sectional view of a substrate on which an aligned monomolecular film is formed according to Embodiment 1 of the present invention, which is magnified to a molecular level.

Though the rubbing was applied to the monomolecular film 24a here, the rubbing may be carried out to the glass substrate 21 under the same conditions before the monomolecular layer forming process, and a monomolecular film may be formed on the glass substrate 21 having been subjected to the rubbing. In this case also, an identical aligned monomolecular film was obtained. Furthermore, in this case, after the removal of the resist, the same washing as the chloroform washing after the monomolecular film formation may be carried out again, and the substrate may be lifted up in a substantially perpendicular direction with respect to a liquid level of the washing organic solvent 44 so that the solvent should be drained in the rubbing direction. By so doing, a monomolecular film 24b aligned accurately in the draining direction was obtained (FIG. 9).

Figure 10:
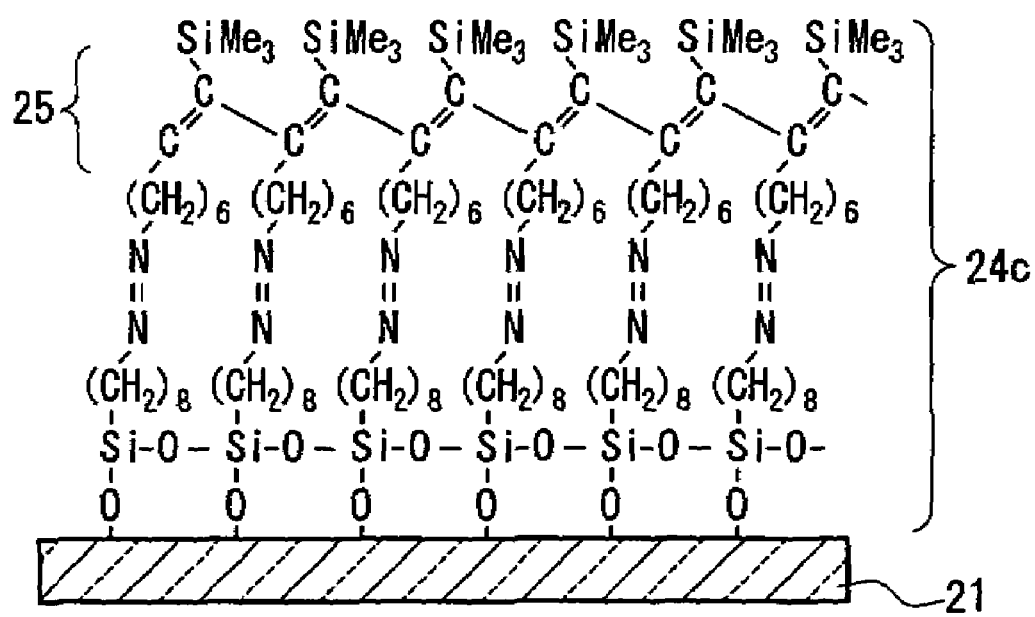
FIG. 10 is a conceptual cross-sectional view of a substrate on which a conductive monomolecular film having a conductive network is formed, which is magnified to a molecular level, for explaining a conductive network forming step after the alignment process according to Embodiment 1 of the present invention.

Thereafter, the substrate was immersed in a toluene solvent containing a Ziegler-natta catalyst (a 5×10$^{-2}$ mol/liter solution of triethylaluminum and a 2.5×10$^{-2}$ mol/liter solution of tetrabutyl titanate), so that acetylene groups of the molecules composing the monomolecular film 24b were catalyst-polymerized, whereby a polyacetylene-type conductive network 25 was formed (FIG. 10). An organic conductive film 24C obtained had a film thickness of approximately 2.0 nm, a length of approximately 10 mm, and a width of approximately 100 μm.

Next, a nickel thin film was formed over the substrate by vapor deposition, and a first electrode 22 and a second electrode 23 were etched by photolithography so as to have a length of 30 μm each, and a gap distance therebetween of 10 μm.

Figure 11:
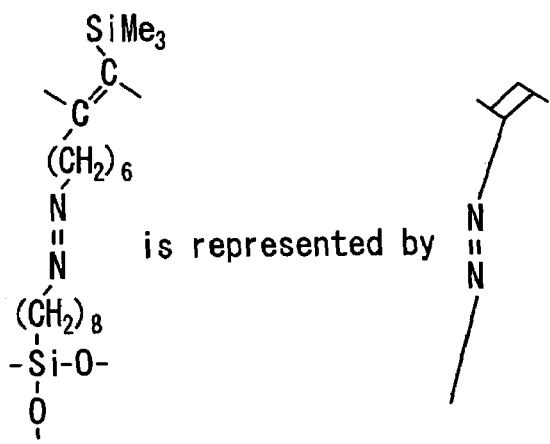
FIG. 11 is a conceptual magnified cross-sectional view of a substrate on which an conductive network as well as first and second electrodes are formed, which is magnified to a molecular level, for explaining a step for forming paired electrodes according to Embodiment 1 of the present invention.
Figure 11:
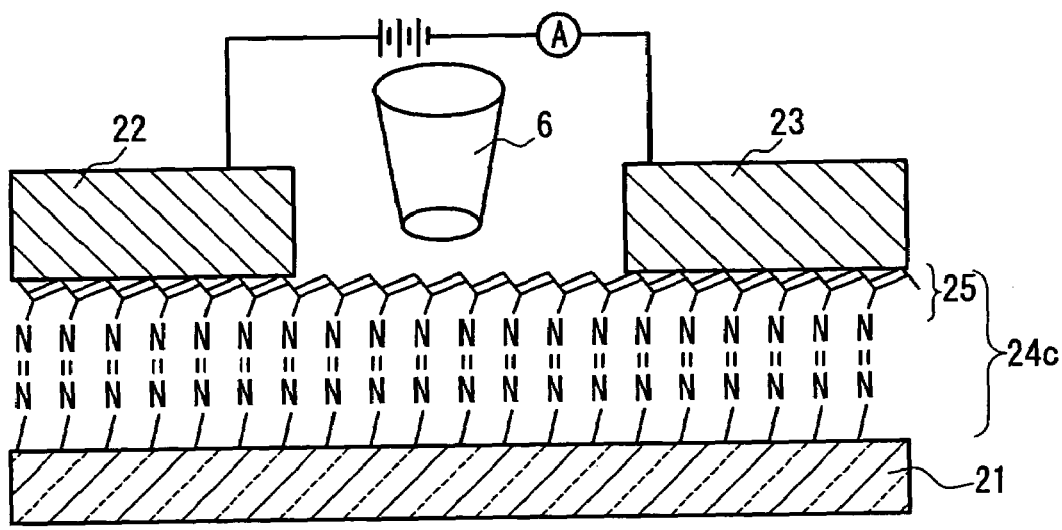

Through these operations, a two-terminal organic photo-electronic device including the first electrode 22 and the second electrode 23 formed on the substrate 21, and the conductive monomolecular film 24 electrically connecting the first electrode 22 and the second electrode 23 with each other was produced, in which the conductive monomolecular film 24c was composed of an aggregate of organic molecules each of which has an azo group, and includes the conductive network 25 in which the molecules composing the conductive monomolecular film are bound with one another by polyacetylene-type conjugated bonds so as to range in a predetermined direction (FIG. 11).

In the two-terminal organic device, since the first electrode 22 and the second electrode 23 were connected with each other via the polyacetylene-type conductive network 25, a voltage of several volts applied across the first and second electrodes 22 and 23 caused a current of several hundreds of nanoamperes to flow (with 1V, approximately 100 nA flown). It should be noted that the conductive monomolecular film 24c was irradiated with visible light before the measurement.

Subsequently, the conductive monomolecular film 24c was irradiated with ultraviolet light, whereby an azo group made a transition from a trans type to a cis type. Consequently, the current value became substantially 0 A. Thereafter, when the film was irradiated with visible light, the azo group made a transition from the cis-type to the trans-type, whereby the original conductivity was reproduced. 6 denotes light converged for irradiating the film.

It should be noted that such a decrease in the conductivity due to irradiation of ultraviolet light is considered to have resulted from the photoisomerization of the azo group (transition from the trans-type to the cis-type), which distorts the polyacetylene-type conjugated bonds in the conductive monomolecular film 24c and therefore decreases the conductivity of the conductive network 25.

In other words, the conductivity of the conductive network 25 was controlled by irradiating light, so that the current flowing between the first electrode 22 and the second electrode 23 was switched.

It should be noted that in the case where the polyacetylene-type conjugated system is used as the conductive network 25, a low degree of polymerization results in a high resistance, which means that the ON current decreases. In this case, by diffusing a dopant having a charge-transfer-type functional group (for instance, a halogen gas or a Lewis acid as an acceptor molecule, and an alkaline metal or an ammonium salt as a donor molecule) in the conductive network 25, that is, carrying out the doping, the ON current was increased. For instance, in the case where iodine was doped in the conductive monomolecular film 24c, a voltage of 1 V applied across the first electrode 22 and the second electrode 23 caused a current of 0.2 mA to flow.

Here, in the case where a conductive substrate made of a metal or the like is used as a substrate, a monomolecular film may be formed on a surface of the conductive substrate with a thin film having an insulating property interposed therebetween. It should be noted that such a structure improved the operation stability of an organic photoelectronic device, since the substrate itself was not charged in the structure.

It should be noted that in the case where a further increased ON current is required, the first electrode 22 and the second electrode 23 may be arranged so that a decreased distance is provided therebetween, or so that they have an increased electrode width each. In the case where a still further increased ON current is required, monomolecular films may be laminated, or a coating having a conductive network may be formed between the first and second electrodes 22 and 23.

Though the catalystic polymerization was used for forming the conductive network, the electrolytic polymerization or the energy beam polymerization using light, an electron beam, X-rays, etc. may be used likewise for forming a conductive network.

Furthermore, apart from a polyacetylene-type conjugated system, examples of a conjugated system applicable as a conductive network include conjugated systems of a polydiacetylene type, a polyacene type, a polypyrrole type, and a polythienylene type. It should be noted that in the case where the catalystic polymerization is carried out, examples of the polymerizable group suitably used herein include a pyrrole group, a thienyl group, a diacetylene group, and the like, apart from the acetylene group described above.

Furthermore, in producing a monomolecular film or a monomolecular build-up film, the Langmuir-Blodgett technique is applicable, besides the chemisorption technique.

Furthermore, by carrying out the electrode forming step for forming the first and second electrodes before the conductive network forming step in which the molecules composing the organic thin film are polymerized with one another, the first and second electrodes can be utilized for carrying out the electrolytic polymerization for forming the conductive network. In other words, by applying a voltage across the first and second electrodes of the organic thin film composed of an aggregate of organic molecules, each of which having a pyrrole group or a thienyl group as an electrolytic-polymerizable functional group, an organic thin film can be formed selectivity between the first and second electrodes by electrolytic polymerization.

First of all, a monomolecular film composed of an aggregate of organic molecules, each of which having a pyrrole group or a thienyl group, a first electrode, and a second electrode are formed on a substrate. The substrate is immersed in an organic solvent in which a substance having a pyrrole group or a thienyl group is dissolved, while a first voltage is applied across the first and second electrodes, and further, a second voltage is applied across the first or second electrode and an external electrode arranged in contact with the organic solvent and above the organic thin film. Through this process, a coating can be formed on a surface of the monomolecular film, while conductive networks can be formed in the monomolecular film and the coating, respectively. In this case, the organic photoelectronic device has a channel part composed of a monomolecular layer and a coating layer in a polymer film form, in which the monomolecular layer and the coating have the conductive network in each.

Alternatively, first of all, a monomolecular film composed of an aggregate of organic molecules, each of which having a pyrrole group or a thienyl group, a first electrode, and a second electrode are formed on a substrate, and a conductive network of a first structure is formed in the monomolecular film. Subsequently, the substrate is immersed in an organic solvent in which a substance having a pyrrole group or a thienyl group is dissolved, while a first voltage is applied across the first and second electrodes, and a second voltage is applied across the first or second electrode and an external electrode arranged in contact with the organic solvent and above the organic thin film. Through this process, a coating can be formed further on the monomolecular film in which a conductive network of a polypyrrole type or a polythienylene type is formed, while a conductive network of a second structure of a polypyrrole type or a polythienylene type can be formed in the coating also. In this case, the organic photoelectronic device has a channel part composed of a monomolecular layer and a coating layer in a polymer film form, the monomolecular layer and the coating layer having the conductive network in each.

Alternatively, a monomolecular film or a monomolecular build-up film is prepared that is composed of an aggregate of organic molecules each of which has, as a polymerizable group, an acetylene group, a diacetylene group, or the like that is a functional group polymerized by an energy beam, and an energy beam of ultraviolet rays, far-ultraviolet rays, an electric beam, X-rays or the like is projected to the film so as to polymerize the molecules that compose the monomolecular film or the monomolecular build-up film, whereby a conductive network is formed Example 2

A chemical compound expressed by a chemical formula (3) shown below is used in the present example:

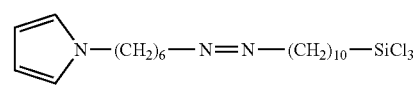

(3)

The chemical compound expressed by the formula (3) was diluted to 1 wt % with a dehydrated dimethyl silicone solution, whereby a chemisorption liquid was prepared. A glass fiber with a diameter of 1 mm was immersed in the chemisorption liquid at room temperature (25° C.) for one hour, so that dehydrochlorination occurred on the surface of the glass fiber, whereby a thin film was formed thereon. Then, the foregoing chemical compound remaining non-reacted thereon was removed by washing the glass fiber with a chloroform non-aqueous solution. Thus, dehydrochlorination occurred between hydroxyl groups on the surface of the glass fiber and chlorosilyl groups (—SiCl) of the foregoing chemical compound, and a monomolecular film composed of molecules expressed by a chemical formula (4) shown below was formed:

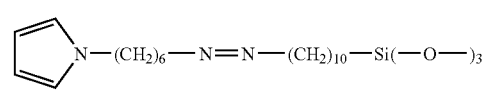

(4)

Next, the glass fiber with the monomolecular film formed thereon was immersed in a chloroform solution for washing, and the glass fiber was lifted up out of the chloroform solution in a manner such that the solution was drained in a lengthwise direction of the glass fiber, whereby the monomolecular film was aligned.

Subsequently, a nickel thin film was formed by vapor deposition on a part of an end of the glass fiber.

Thereafter, an electric field of 5 V/cm was applied across the electrodes in a pure water solution so as to cause electrolytic oxidation polymerization. The electrolytic oxidation polymerization was caused under the conditions of a reaction temperature of 25° C. and a reaction period of eight hours. Through this process, a conductive network was formed by electrolytic polymerization so as to electrically connect the electrodes. Here, since conjugated bonds were self-organized in the direction of the electric field, consequently the electrodes were connected electrically with each other via a conductive network when the polymerization was completed. A chemical formula (5) expressing an organic conductive film obtained is shown below:

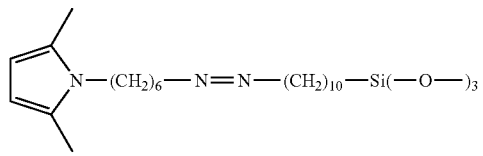

(5)

The organic conductive film obtained had a thickness of approximately 2.0 nm, including a polypyrrole part with a thickness of approximately 0.2 nm, and had a length of 10 nm and a width of 100 μm. Besides, the organic conductive film obtained was transparent with respect to visible light.

It was determined by an atomic force microscope (AFM) available in the market (SAP 3800N, manufactured by Seiko Instruments Inc.) in the AFM-CITS mode that the obtained organic conductive film without doping had a conductivity ρ of $1\times10^3$ S/cm at room temperature (25° C.) under conditions of a voltage of 1 mV and an amperage of 160 nA.

Further, by doping iodine ions, the conductivity ρ changed to $1\times10^4$ S/cm.

An electric cable was produced by forming an insulation film so that the insulation film covered the surface of the organic thin film thus obtained. A cross-sectional view of an electric wire thus obtained is shown in FIG. 13. In FIG. 13, 50 denotes the electric cable, 51 denotes a glass core wire, 52 denotes a polypyrrole electrolytic-oxidation-polymerization film, and 53 denotes a coating insulation film made of a silicone rubber that is cured at room temperature. In this electric cable, the conductivity of the conductive network was controlled by projecting light to the glass fiber, so as to switch the electric current flowing between the electrodes.

In the present example, the electric cable may be a collective wire including a plurality of core wires that are insulated electrically from one another.

Furthermore, a metal may be used in place of glass for forming the core wire for forming an electric wire. In the case where the core wire is made of a metal, a monomolecular film can be formed easily by forming an oxide on a surface of the metal.

Example 3

As to Example 1 described above, whether the conductive molecules are aligned can be determined by forming a liquid crystal cell 60 as shown in FIG. 14, interposing the same between polarization plates 67 and 68, and observing the same from a position 70 while projecting light thereto from a back side. The liquid crystal cell 60 is formed by the following process. Glass plates 61 and 63 on which conductive molecular films 62 and 64 are formed, respectively, are arranged so that the conductive molecular films 62 and 64 are arranged on inner sides with a gap of a distance of 5 μm to 6 μm provided therebetween, and are sealed by applying an adhesive 65 to a periphery of the same. Then, a liquid crystal composition 66 (nematic liquid crystal, for instance, LC, MT-5087LA manufactured by CHISSO CORPORATION) is injected into the gap.

(1) In the case where the polarization plates 67 and 68 are arranged so that polarization directions thereof cross each other, the conductive molecular films 62 and 64 are arranged so that the alignment directions thereof coincide with each other, and so that the alignment direction is parallel with a polarization direction of one of the polarization plates, and is perpendicular to a polarization direction of the other polarization plate. If complete alignment is achieved, the liquid crystal is aligned and has a homogeneous color of black. In the case where a homogeneous color of black is not exhibited, this means that the alignment is defective.

(2) In the case where the polarization plates 67 and 68 are arranged so that polarization directions are parallel with each other, the conductive molecular films 62 and 64 are arranged so that the alignment directions thereof coincides with each other, and so that the alignment direction is parallel with the polarization direction of both of the polarization plates. If complete alignment is achieved, the liquid crystal is aligned and has a homogeneous color of white. In the case where a homogeneous color of white is not exhibited, this means that the alignment is defective.

It should be noted that the in the case where a substrate on the opposite side is not transparent, only one polarization plate is arranged on the upper side, and light is projected from a front side so that observation is carried out with the reflected light.

By this method, it was determined that the conductive molecular film obtained in Example 1 was aligned. The conductive molecular film of Example 2 is presumed to have been aligned since the process for manufacturing the same is the same as that of Example 1.

INDUSTRIAL APPLICABILITY

As described above, with the present invention, even if a device is subjected to micromachining in the 0.1 μm order or less for denser packaging, it is possible to provide an organic thin film having a conductivity and a photoresponsivity irrespective of crystallinity, as well as an electrode, a wire, and a densely-packaged optical device in each of which the organic thin film is used. Further, it is possible to provide an organic photoelectronic device with excellent flexibility by forming the same on a plastic substrate or the like.

The invention claimed is:

1. A conductive organic thin film, comprising organic molecules, each of the organic molecules having:
    a terminal binding group that is bound with a surface of a substrate by a covalent bond, the terminal binding group being present at one of the ends of the organic molecule;
    a conjugate group that is polymerized with another molecule, the conjugate group being present in the organic molecule; and
    a photoresponsive functional group including no active hydrogen, the photoresponsive functional group being present between the terminal binding group and the conjugate group,
wherein
the organic molecules are aligned, and
the conjugate group of each molecule is polymerized with the conjugate group of another molecule so that a conductive network is formed, and
the conductive network is switchable between different states having first and second conductivities, respectively, the switching being conducted by selecting a wavelength of light projected to the conductive network, and the photoresponsive functional group including no active hydrogen is an azo group (—N═N—).

2. The conductive organic thin film according to claim 1, wherein the polymerization is of at least one type selected from electrolytic oxidation polymerization, catalystic polymerization, and energy beam polymerization.

3. The conductive organic thin film according to claim 1, wherein the conjugate group that functions in the polymerization is at least one selected from conjugate groups that function in forming polypyrrole, polythienylene, polyacetylene, polydiacetylene, and polyacene.

4. The conductive organic thin film according to claim 1, wherein the terminal binding group forms at least one type of bond selected from a siloxane-type (—SiO—) bond and a —SiN— type bond (Si and N may be bound with other binding groups according to their valences, respectively).

5. The conductive organic thin film according to claim 1, wherein the terminal binding group is formed by at least one elimination reaction selected from the dealcoholization and the dehydrochlorination.

6. The conductive organic thin film according to claim 1, wherein the alignment of the molecules is achieved by at least one type of process selected from:

an alignment process by rubbing;

a tilt draining process of lifting up a substrate with a tilt out of a reaction solution after molecules are bound with a surface of the substrate by covalent bonds through an elimination reaction; and a polarized-light projecting process.

7. The conductive organic thin film according to claim 1, wherein a conductive portion of the organic thin film is transparent with respect to light having a wavelength in a visible range.

* * * * *

UNITED STATES PATENT AND TRADEMARK OFFICE
CERTIFICATE OF CORRECTION

PATENT NO. : 7,078,103 B2
APPLICATION NO. : 10/451166
DATED : July 18, 2006
INVENTOR(S) : Ogawa It is certified that error appears in the above-identified patent and that said Letters Patent is hereby corrected as shown below:

Title Page; second column, lines 2-3 of Other Publications:"pyrroles." " should read --pyrroles" --.
Page 2, second column, line 4: "Berlin. Anna" should read --Berlin, Anna--.

Signed and Sealed this

Sixteenth Day of October, 2007

JON W. DUDAS
*Director of the United States Patent and Trademark Office*